United States Patent
Frougier et al.

(10) Patent No.: US 10,170,520 B1
(45) Date of Patent: Jan. 1, 2019

(54) NEGATIVE-CAPACITANCE STEEP-SWITCH FIELD EFFECT TRANSISTOR WITH INTEGRATED BI-STABLE RESISTIVE SYSTEM

(71) Applicant: International Business Machines Corporation, Armonk, NY (US)

(72) Inventors: Julien Frougier, Albany, NY (US); Nicolas Loubet, Guilderland, NY (US); Ruilong Xie, Schenectady, NY (US); Daniel Chanemougame, Albany, NY (US); Ali Razavieh, Albany, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/894,128

(22) Filed: Feb. 12, 2018

(51) Int. Cl.
- *H01L 29/02* (2006.01)
- *H01L 27/24* (2006.01)
- *H01L 29/06* (2006.01)
- *H01L 23/535* (2006.01)
- *H01L 29/78* (2006.01)

(Continued)

(52) U.S. Cl.
CPC .... *H01L 27/2436* (2013.01); *H01L 21/28291* (2013.01); *H01L 21/76805* (2013.01); *H01L 21/76895* (2013.01); *H01L 23/535* (2013.01); *H01L 29/0649* (2013.01); *H01L 29/6684* (2013.01); *H01L 29/66795* (2013.01); *H01L 29/7851* (2013.01); *H01L 29/78391* (2014.09); *H01L 45/1683* (2013.01)

(58) Field of Classification Search
CPC .......... H01L 29/6684; H01L 21/76895; H01L 21/76805; H01L 29/66795; H01L 21/28291; H01L 29/7851; H01L 29/78391; H01L 23/535; H01L 29/0649; H01L 45/1683
See application file for complete search history.

(56) References Cited

U.S. PATENT DOCUMENTS

2018/0166448 A1* 6/2018 Cheng .................... G11C 16/02

OTHER PUBLICATIONS

Appendix P, 2018.

* cited by examiner

*Primary Examiner* — Mohsen Ahmadi
*Assistant Examiner* — Wasiul Haider
(74) *Attorney, Agent, or Firm* — Garg Law Firm, PLLC; David M. Quinn

(57) ABSTRACT

Fabricating a negative capacitance steep-switch transistor includes receiving a semiconductor structure including a substrate, a fin, a source/drain, a gate, a cap disposed upon the gate, a trench contact disposed upon the source/drain, and an inter-layer dielectric. A source/drain recess is formed in the inter-layer dielectric extending to the trench contact, and a gate recess is formed in the inter-layer dielectric extending to the gate. A ferroelectric material is deposited within the gate recess, and a source/drain contact is formed within the source/drain recess. A gate contact is formed within the gate recess, and a contact recess is formed in a portion of the source/drain contact. A bi-stable resistive system (BRS) material is formed in the contact recess, and a metallization layer contact is formed upon the BRS material. A portion of the source/drain contact, the BRS material, and a portion of the metallization layer contact forms a reversible switch.

20 Claims, 20 Drawing Sheets

(51) Int. Cl.
*H01L 45/00* (2006.01)
*H01L 29/66* (2006.01)
*H01L 21/768* (2006.01)
*H01L 21/28* (2006.01)

US 10,170,520 B1

NEGATIVE-CAPACITANCE STEEP-SWITCH FIELD EFFECT TRANSISTOR WITH INTEGRATED BI-STABLE RESISTIVE SYSTEM

TECHNICAL FIELD

The present invention relates generally to a method for fabricating a steep-switch field effect transistor and an apparatus formed by the method. More particularly, the present invention relates to a method for fabricating a negative capacitance steep-switch field effect transistor with an integrated bi-stable resistive system and an apparatus formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in rigid plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation is controlled to achieve the desired shape and electrical characteristics on the wafer.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the free charged carriers and consequently the electrical conductivity of a channel between the source and the drain. The channel is a charge carrier pathway constructed using a semiconductor material.

SUMMARY

The illustrative embodiments provide a method, apparatus, and computer program product. An embodiment of a method for fabricating a negative capacitance steep-switch transistor includes receiving a semiconductor structure including a substrate, a fin disposed on the substrate, a source/drain disposed on the substrate adjacent to the fin, a gate, a cap disposed upon the gate, a trench contact disposed upon the source/drain, a shallow trench isolation (STI) layer disposed upon the substrate, and an inter-layer dielectric disposed on the trench contact and the cap. The embodiment further includes forming a source/drain recess in the inter-layer dielectric extending to the trench contact, and forming a gate recess in the inter-layer dielectric extending to the gate. The embodiment further includes depositing a ferroelectric material within the gate recess, and forming a source/drain contact within the source/drain recess in contact with the trench contact. The embodiment further includes forming a gate contact within the gate recess in contact with the ferroelectric material, and forming a contact recess in a portion of the source/drain contact. The embodiment further includes depositing a bi-stable resistive system (BRS) material in the contact recess in contact with the portion of the source/drain contact. The embodiment further includes forming a metallization layer contact upon the BRS material, a portion of the source/drain contact, the BRS material, and a portion of the metallization layer contact forming a reversible switch.

In an embodiment, depositing the ferroelectric material within the gate recess further comprises conformally depositing the ferroelectric material upon a top surface of the inter-layer dielectric, the S/D recess, and the gate recess, depositing an organic planarization layer (OPL) to a bottom portion of the gate recess to mask the bottom portion of the gate recess, etching the ferroelectric material except for the ferroelectric material masked by the OPL in the bottom portion of the gate recess, and stripping the OPL from the gate recess.

In an embodiment, the source/drain recess and the gate recess are formed in the inter-layer dielectric by a reactive ion etching (RIE) process. In an embodiment, the BRS material comprises an insulator-to-metal transition (IMT) material. In an embodiment, depositing the BRS material in the source/drain recess includes depositing the IMT material in contact with the portion of the source/drain contact. An embodiment further includes removing a portion of the IMT material outside of the source/drain recess using a planarization process. In an embodiment, the planarization process includes a chemical mechanical planarization (CMP) process.

In an embodiment, the BRS material comprises a threshold-switching selector. In an embodiment, depositing the BRS material in the source/drain recess comprises depositing an oxide layer within the recess, and forming a top electrode within the recess upon the oxide layer.

An embodiment further includes applying an insulation cap layer to the structure, and depositing a dielectric layer upon the insulation layer, the metallization layer contact being formed through the insulation cap layer and the dielectric layer.

An embodiment of an apparatus includes a semiconductor structure including a substrate, a fin disposed on the substrate, a source/drain disposed on the substrate adjacent to the fin, a gate, a cap disposed upon the gate, a trench contact disposed upon the source/drain, a shallow trench isolation (STI) layer disposed upon the substrate, and an inter-layer dielectric disposed on the trench contact and the cap. The embodiment further includes a source/drain recess formed in the inter-layer dielectric extending to the trench contact, and a gate recess formed in the inter-layer dielectric extending to the gate. The embodiment further includes a ferroelectric material deposited within the gate recess. An embodiment further includes a source/drain contact formed within the source/drain recess in contact with the trench contact, and a gate contact formed within the gate recess in contact with the ferroelectric material. The embodiment further includes a contact recess formed in a portion of the source/drain contact, and a bi-stable resistive system (BRS) material deposited in the contact recess in contact with the portion of the source/drain contact. The embodiment further includes a metallization layer contact formed upon the BRS material, a portion of the source/drain contact, the BRS material, and a portion of the metallization layer contact forming a reversible switch.

An embodiment includes a computer usable program product. The computer usable program product includes one or more computer-readable storage devices, and program instructions stored on at least one of the one or more storage devices.

In an embodiment, the computer usable code is stored in a computer readable storage device in a data processing system, and wherein the computer usable code is transferred over a network from a remote data processing system.

In an embodiment, the computer usable code is stored in a computer readable storage device in a server data processing system, and wherein the computer usable code is downloaded over a network to a remote data processing system for use in a computer readable storage device associated with the remote data processing system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
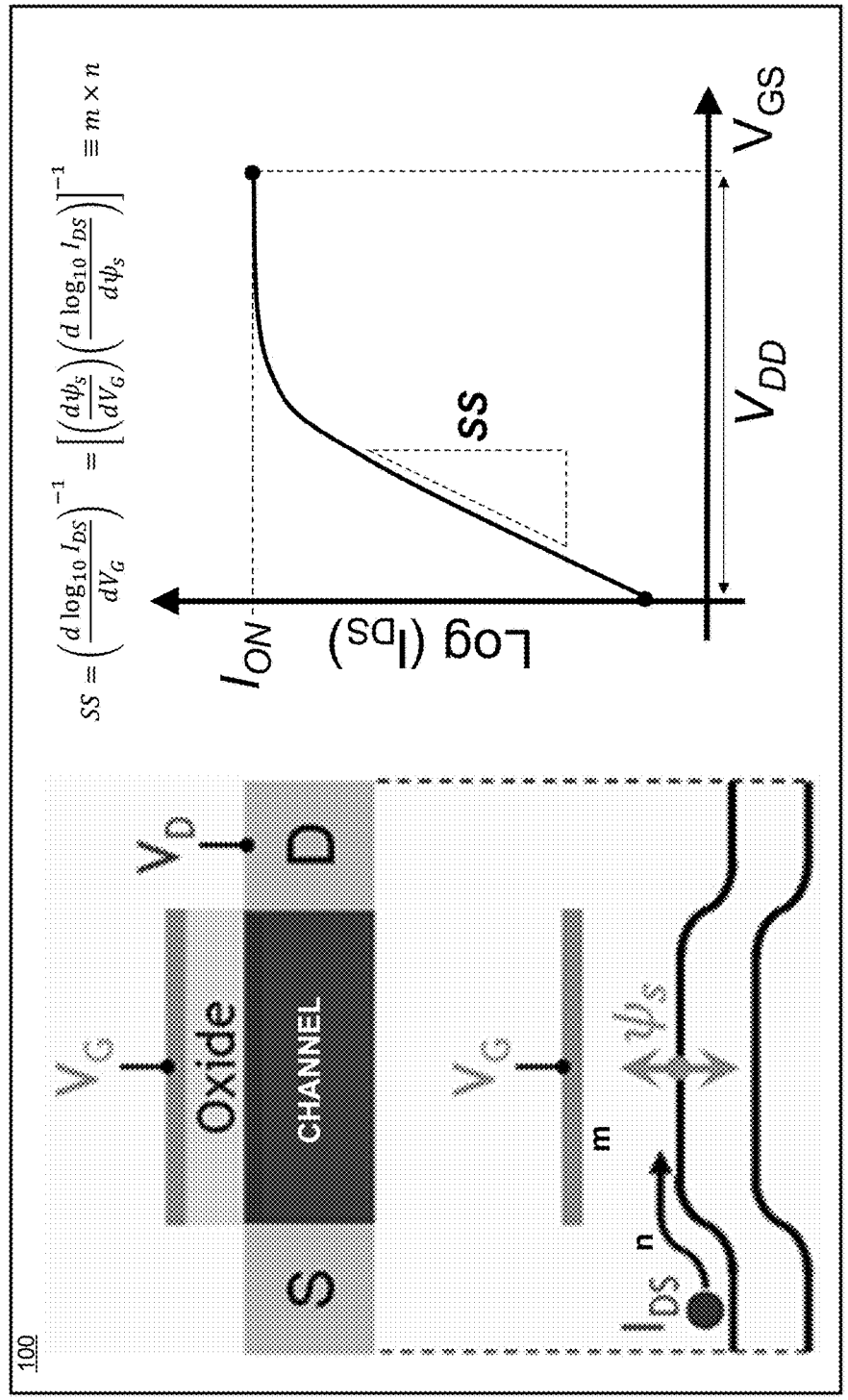
FIG. 1 illustrates a simplified illustration of an operating principal and dependency of a FET subthreshold slope on key physical parameters.

One or more embodiments of the present invention are directed to a process for fabricating a Negative Capacitance Steep-Switch Field Effect Transistor (NCSS-FET) having an integrated bi-stable resistive system (BRS) and ferroelectric material deposited on the gate and an apparatus formed by the process. Conventional metal-oxide-semiconductor field effect transistors ("MOSFETs") typically have a subthreshold slope that is thermally limited to about 60-70 mV per decade at room temperature (about 300 Kelvin). In other words, for typical FET transistors, increasing the gate voltage by about 60 mV results in a corresponding drain current increase of less than about a factor of 10. This limited subthreshold slope cannot provide arbitrarily fast transitions between "OFF" (low current) and "ON" (high current) states of the FET transistor. Accordingly, the user of conventional FETs results in a trade-off between low power and high performance.

A semiconductor fabrication process typically includes a front-end-of-line (FEOL) stage, a middle-of-the-line (MOL) stage, and back-end-of-line (BEOL) stage. Typical FEOL processes include wafer preparation, well formation, channel formation, Shallow Trench Isolation (STI) formation, gate patterning, spacer, extension implantation, Source/Drain Epitaxy formation and implantation, and silicide formation. Typical MOL processes are mainly directed to source/drain (S/D) contact (CA) formation and gate contact (CB) formation. The MOL level of semiconductor manufacturing includes forming local interconnects within a device. In a typical MOL stage of a manufacturing process, an interface material, such as nickel silicide, is deposited on the source, drain, and gate of a transistor structure and contacts are then formed on top of the structures. In a typical BEOL stage of a manufacturing process, interconnects are formed on top of the contacts formed during the MOL stage to interconnect individual transistors and/or other semiconductor devices on the wafer.

One or more embodiments of the invention provide a Negative Capacitance Steep-Switch FET (NCSS-FET) which leverages both a Bi-Stable Resistive System (BRS) monolithically integrated on the Source and/or Drain and a ferroelectric material integrated on the gate to further reduce the subthreshold slope by enhancing the coupling capacitance between the surface potential and the applied gate voltage to achieve sub-thermal subthreshold slope (e.g., sub-kT/q). In other words, a subthreshold slope much less than the fundamental Boltzmann limit of 60 mV per decade at room temperature is achievable. The BRS includes any material or combination of materials that exhibits a unipolar, abrupt, reversible, and electrically triggered resistance switch between two stable resistance states, such as but not limited to, insulator-to-metal transition (IMT) materials, threshold-switching selectors (TSS), resistive memories, and Spin-Transfer-Torque (STT) structures. Examples of IMT materials include but are not limited to relaxed, strained, 3D-bulk, thin film, 2D-nanosheet, 1D-nanowire such as $VO_2$, $NbO_2$, $Ca_2RuO_4$, $LaCoO_3$, $Ti_2O_3$, $Ti_3O_5$, $SMNiO_3$, $NdNiO_3$, $V_2O_3$, $V_4O_7$, $Fe_3O_4$, and any oxides of the form $ABO_3$ Perovskite. Examples of TSSs include but are not limited to threshold-switching selectors based on a combination of a thin insulation layer with a metal such as $Ag/HfO_2$, $Cu/HfO_2$, $Ag/TiO_2$, $Cu_xS$, $Ag/a$-$Si$, and $AgTe/TiN/TiO_2/TiN$. Examples of the ferroelectric material integrated on top of the high-K Metal Gate (HKMG) stack or into the HKMG stack includes, but not limited to, doped Hafnium Oxide ($ZrO_2$:$HfO_2$, Y:$HfO_2$, Si:$HfO_2$, Al:$HfO_2$, La: $HfO_2$, . . . ), $Pb(Zr,Ti)O_3$, $BiFeO_3$, $BaTiO_3$.

In accordance with one or more embodiments, a negative capacitance steep-switch FET is achieved by monolithically integrating a Bi-stable Resistive System (BRS) on the Source and/or Drain and depositing a ferroelectric material on the gate of a FET such as a planar MOSFET, SOI-FET, Fin-FET, or Nanosheet-FET. In particular embodiments, the BRS is monolithically integrated at a MOL level of a semiconductor fabrication process. In other particular embodiments, the BRS is monolithically integrated at a BEOL level of a semiconductor fabrication process.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate NCSS-FET devices as described herein.

For the clarity of the description, and without implying any limitation thereto, the illustrative embodiments are described using a single NCSS-FET device. An embodiment can be implemented with a different number of NCSS-FETs within the scope of the illustrative embodiments. Furthermore, a transistor channel of various embodiments can have its shape and geometrical orientation other than the ones found in the NCSS-FETs described herein including but not limiting to planar, surround-gate, multiple-gate, nano-wire or nano-sheet, and vertical channels. The NCSS-FETs can be wired into a number of useful circuits such as CMOS logic circuits (e.g. NAND and NOR), memory cells (e.g. SRAM), analog circuits (e.g. PLL), and input/output (I/O) circuits.

Furthermore, simplified diagrams of the example NCSS-FET devices are used in the figures and the illustrative embodiments. In an actual fabrication of an NCSS-FET device, additional structures that are not shown or described herein may be present without departing the scope of the illustrative embodiments. Similarly, within the scope of the illustrative embodiments, a shown or described structure in the example NCSS-FETs may be fabricated differently to yield a similar operation or result as described herein.

Differently shaded portions in the two-dimensional drawing of the example NCSS-FETs are intended to represent different structures in the example NCSS-FETs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a NCSS-FET according to the illustrative embodiments.

Furthermore, the illustrative embodiments are described with respect to an NCSS-FET only as an example. The steps described by the various illustrative embodiments can be adapted for fabricating other planar and non-planar devices, and such adaptations are contemplated within the scope of the illustrative embodiments.

An embodiment when implemented in a software application causes a fabrication system to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a manufacturing device, tool, or data processing system, comprises substantial advancement of the functionality of that manufacturing device, tool, or data processing system in fabricating NCSS-FET devices.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

FIG. 1 illustrates a simplified illustration of an operating principal and dependency of a FET subthreshold slope on key physical parameters 100. The subthreshold slope SS of a FET may be determined by the following equation:

$$SS = \left(\frac{d\log_{10} I_{DS}}{dV_{GS}}\right)^{-1} = \left[\left(\frac{d\psi_s}{dV_{GS}}\right)\left(\frac{d\log_{10} I_{DS}}{d\psi_s}\right)\right]^{-1} \equiv m \times n$$

In which $I_{DS}$ is the drain-source current, $V_{GS}$ is the applied gate voltage, and $\psi_s$ is the surface potential. The variable m quantifies the coupling capacitance between the surface potential $\psi_s$ and the applied gate voltage $V_{GS}$, and the variable n quantifies the coupling capacitance between the drain-source current $I_{DS}$ and the surface potential $\psi_s$. A conventional Boltzmann-limited FET, such as a planar FET or fin-FET, has characteristics of m>1 and n=60, whereas a NCSS-FET having a BRS integrated on the Source and/or Drain and a Ferroelectric material integrated on the gate fabricated as described with respect to one or more embodiments exhibits m<1 and n<60. As a result, the NCSS-FET exhibits a subthreshold switching slope of less than the fundamental Boltzmann limit of 60 millivolts per decade at room temperature by harnessing both the abrupt resistance switch of the BRS integrated in series with the source or drain of the MOSFET and the negative capacitance of the ferroelectric integrated on the gate of the MOSFET.

Figure 2:
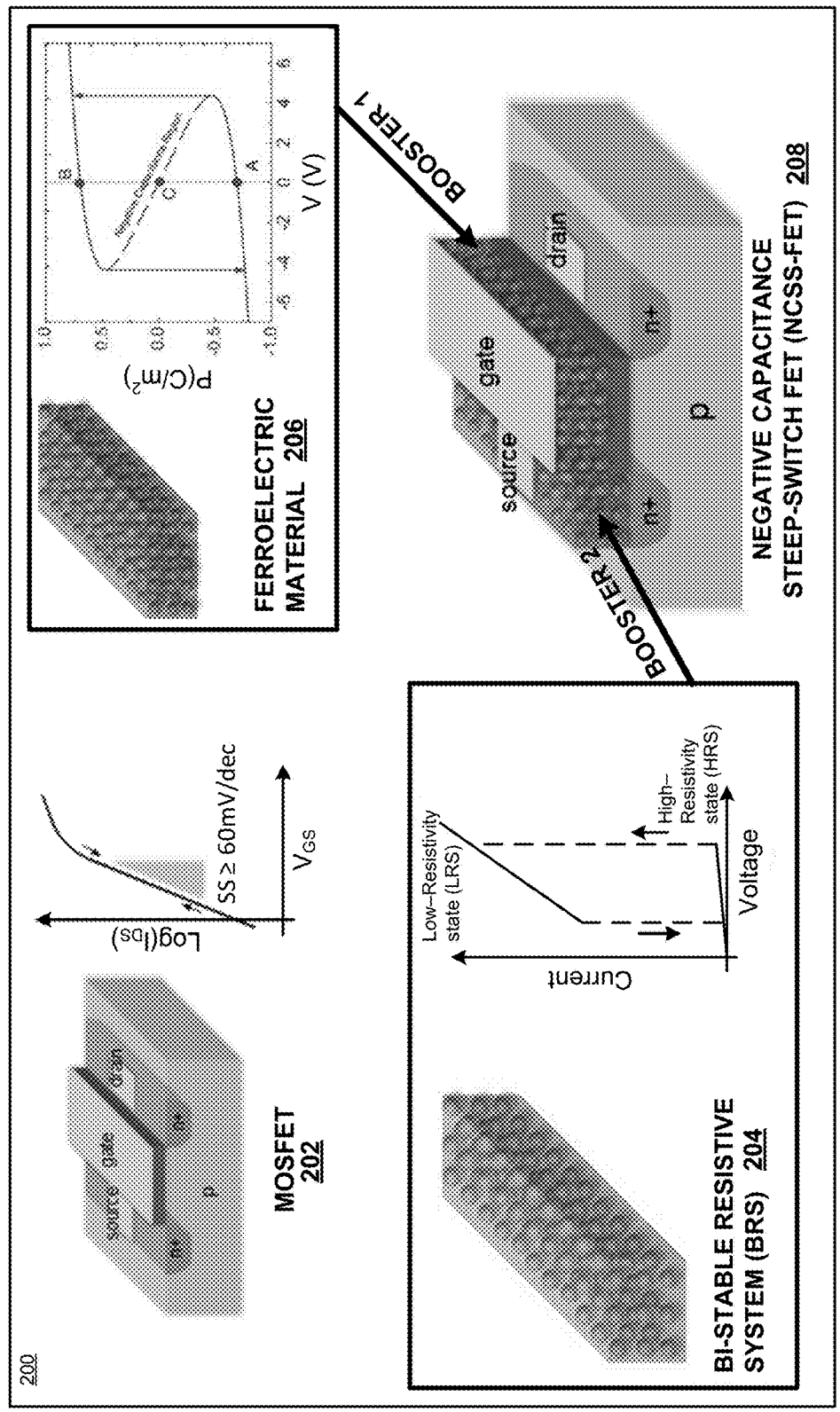
FIG. 2 depicts example operating principles of a Negative Capacitance Steep-Switch FET (NCSS-FET) according to one or more embodiments.
Figure 3:
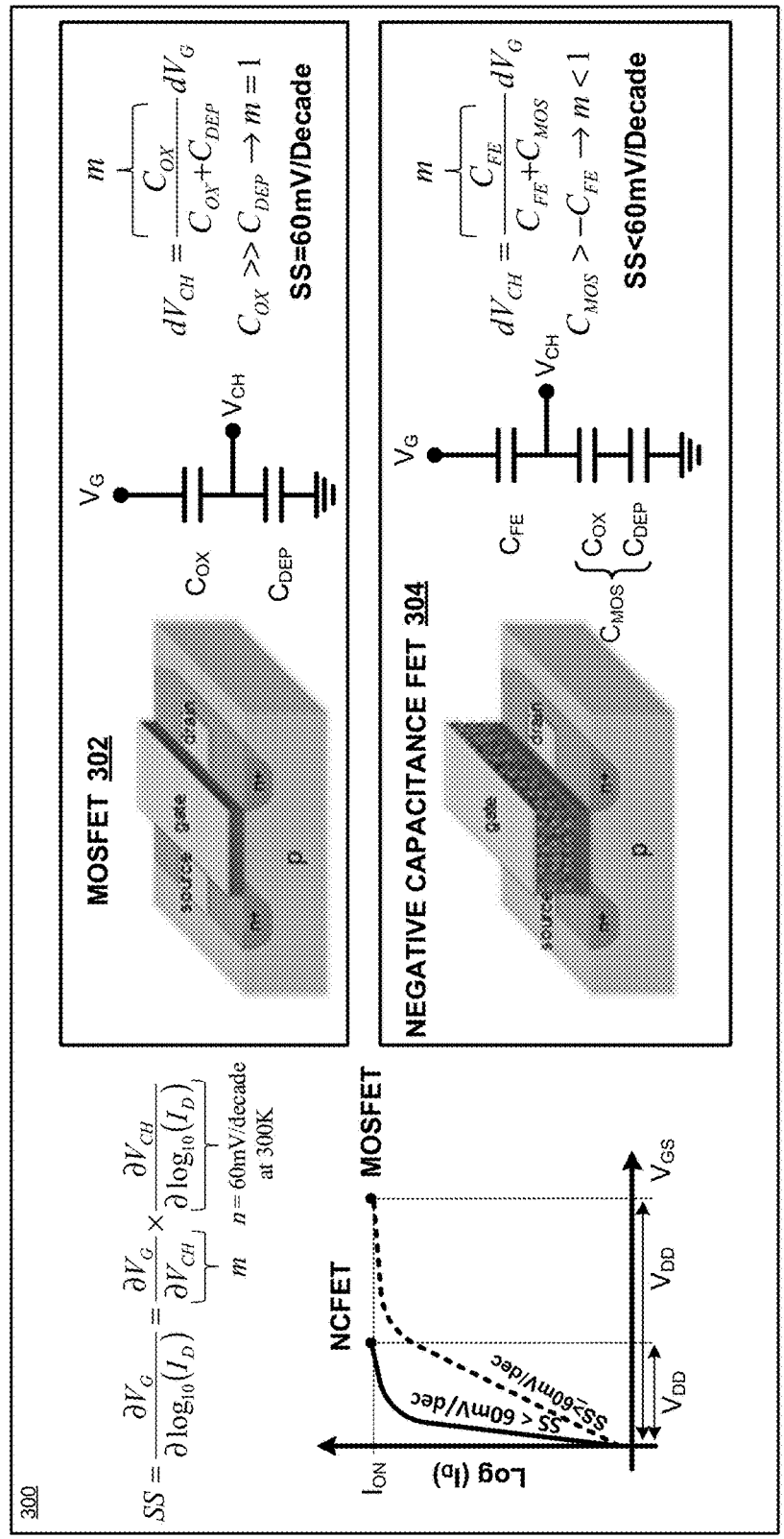
FIG. 3 depicts physical and electrical mechanism differences between conventional MOSFET and Negative Capacitance FET.
Figure 4:
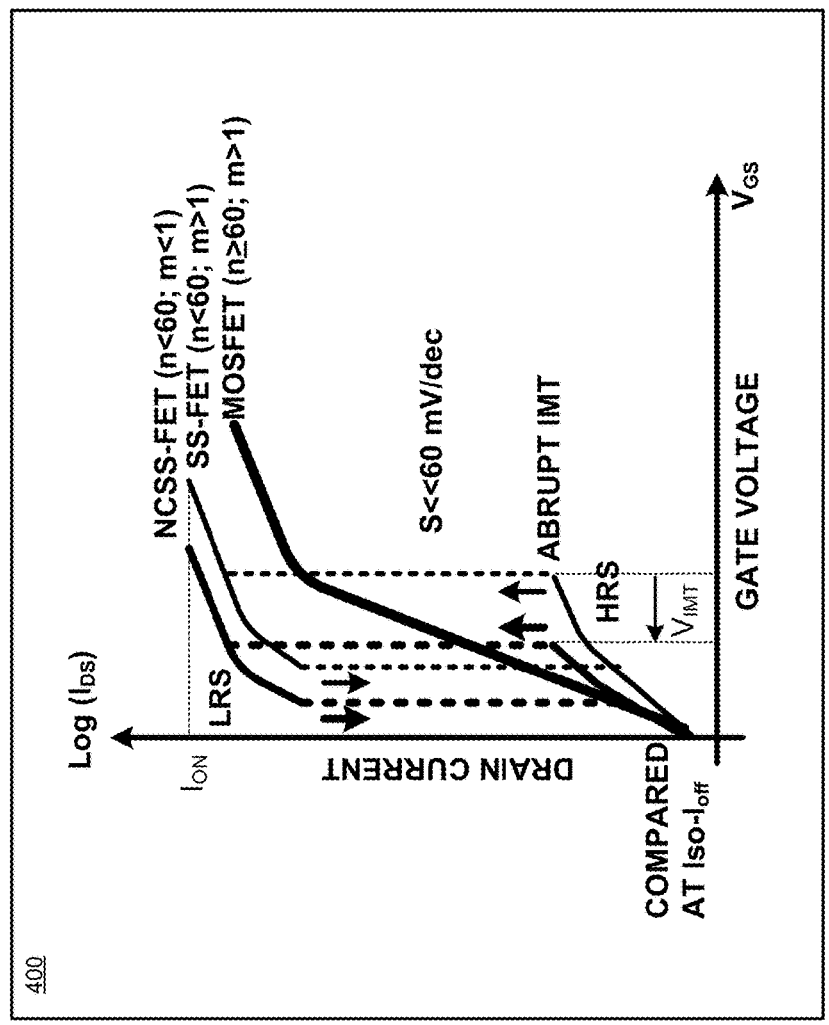
FIG. 4 depicts further example operating principles of a Negative Capacitance Steep-Switch FET (NCSS-FET) according to one or more embodiments.

FIGS. 2-4 depict example operating principles of a Negative Capacitance Steep-Switch FET (NCSS-FET) according to one or more embodiments. Referring to FIG. 2, a MOSFET 402 is combined with the steep switching capabilities of a bi-stable resistive system (BRS) 204 deposited on the source/drain and a ferroelectric material 206 deposited on the gate to produce a negative capacitance steep-switch FET (NCSS-FET) in accordance with one or more embodiments. As a result, the robust field-effect dynamics of a MOSFET is combined with the enhanced coupling capacitance between applied gate voltage and surface potential provided by the ferroelectric material on the gate, and the steep-switching of the BRS. In particular embodiments, the BRS includes insulator-to-metal transition (IMT) materials or a threshold-switching selector (TSS).

Referring to FIG. 3, corresponding equivalent circuits and example current-voltage behavior for a MOSFET 302 and a negative capacitance FET (NC-FET) 304 are shown. An "m factor" quantifies the coupling capacitance between the applied gate voltage and the surface potential. Ferroelectric material deposited on the gate provides negative capacitance which translates to an "m factor" reduction below unity. This mechanism enables NC-FET to exhibit sub-kT/q subthreshold slope.

Referring to FIG. 4, example operating principles of a negative capacitance steep-switch FET (NCSS-FET) compared to a standard SS-FET and a MOSFET are shown. The NCSS-FET provides one or more of the following advantages (1) a negative capacitance boost (m<1), (2) a reduced off-state leakage current ($I_{OFF}$)=Higher $I_{ON}/I_{OFF}$ ratio, (3) increased $I_{ON}$ at iso-$I_{OFF}$ and (4) a steep switching slope (e.g., sub 60 mV/dec). The NCSS-FET exhibits an electrically induced abrupt resistivity change due to the BRS. The high-resistivity insulating state (HRS) of the BRS exponentially reduces the OFF-state leakage current ($I_{OFF}$) while the abrupt resistance switching to the low-resistivity metallic state (LRS) results in negligible reduction in on-state drive current ($I_{ON}$) of the NCSS-FET. The factors enable a steep switching slope and enhanced $I_{ON}/I_{OFF}$ ratio over conventional MOSFETs. Adding negative capacitance component for the NCSS-FET enables reaching the IMT triggering voltage for lower applied gate voltage and thus delivers targeted $I_{ON}$ at supply voltage compared to a standard SS-FET. As a result, a NCSS-FET us better suited for energy scaling than a standard SS-FET, which is itself better for energy scaling than a standard MOSFET.

Figure 5:
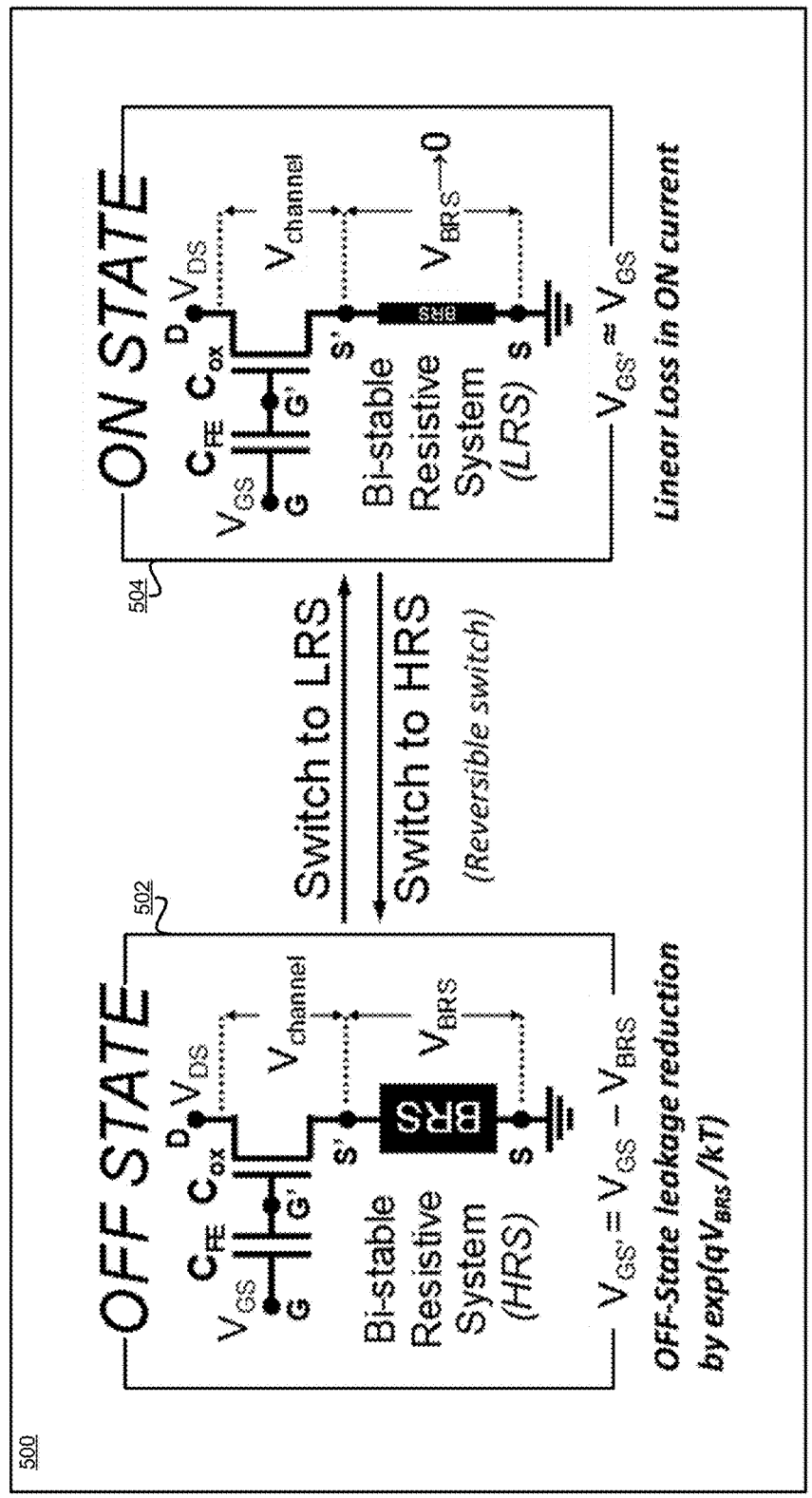
FIG. 5 depicts further example operating principles of a Negative Capacitance Steep-Switch FET (NCSS-FET) according to one or more embodiments.

With reference to FIG. 5, this figure depicts an embodiment of a NCSS-FET architecture structure 500 is shown in an OFF state 502, and an ON state 504. In OFF state 502, when the BRS is in the insulating High Resistance State (HRS), the effective gate voltage of the NCSS-FET ($V_{GS'}$) is reduced by the potential drop across the BRS due to the large insulator resistance. As a result, the OFF-state leakage of the MOSFET is exponentially reduced. In ON state 504, when the BRS is in the metallic Low Resistance State (LRS), the effective gate voltage of the NCSS-FET $V_{GS'} \approx V_{GS}$ since the potential drop across the BRS becomes negligible as the metallic state has multiple orders of magnitude lower resistance. As a result, ON-current loss is negligible. The reversible resistance switch from HRS to LRS can be electrically triggered for both positive and negative voltage polarities which makes the concept applicable to both nFET and pFET technologies as well as compatibility with other CMOS technologies.

Figure 6:
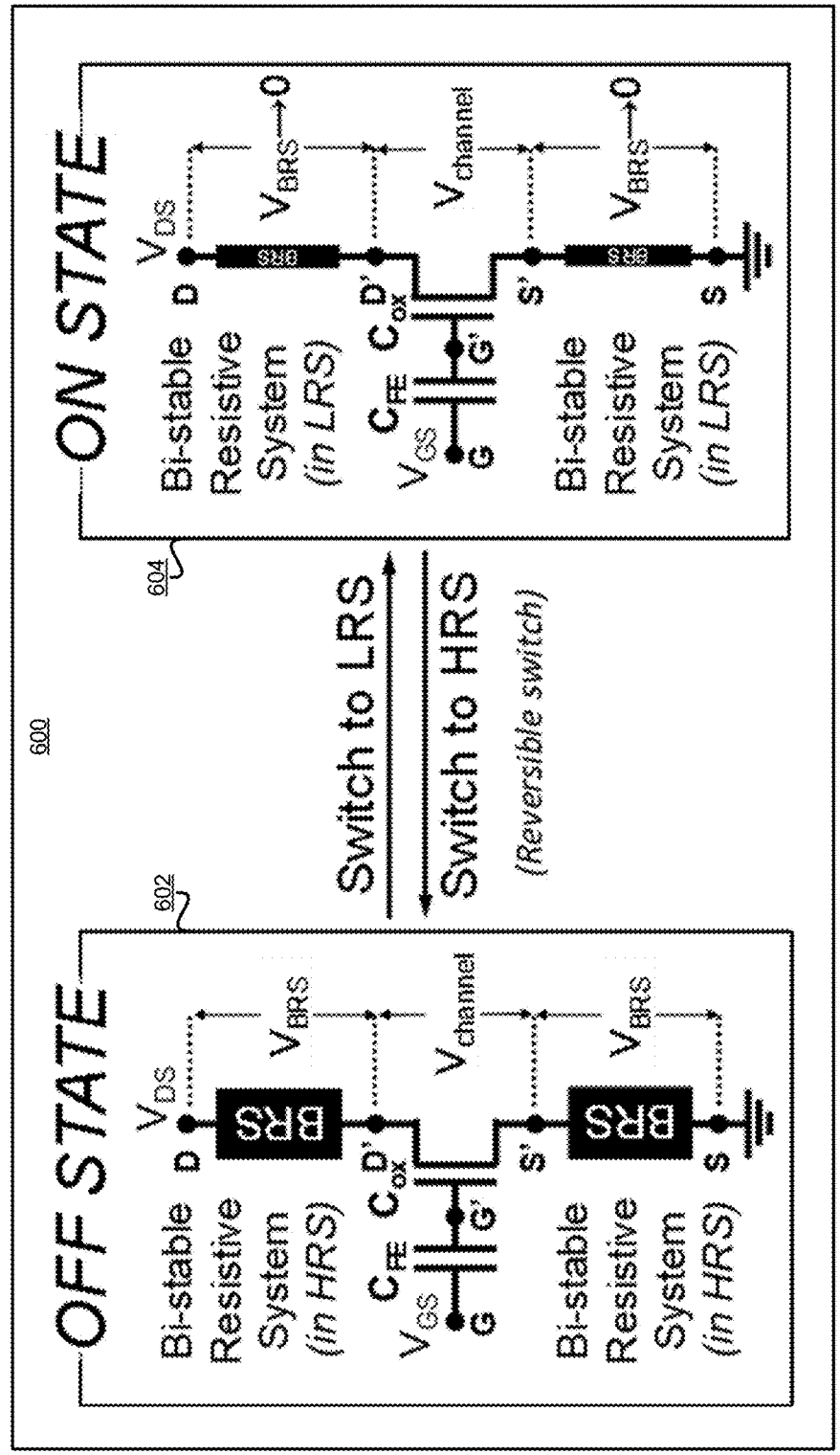
FIG. 6 depicts an embodiment of a symmetrical NCSS-FET architecture structure shown in an OFF state and an ON state.

With reference to FIG. 6, this figure depicts an embodiment of a symmetrical NCSS-FET architecture structure 600 shown in an OFF state 602 and an ON state 604. In the embodiment, of FIG. 6, the BRS is integrated on the source and drain. On top of OFF-state leakage reduction due to source side potential drop, the drain side resistance also significantly reduces the effective drain potential, i.e. significantly reducing the drain-induced barrier lowering (DIBL) effect on the potential barrier in the channel resulting in a potentially exponential effect on OFF-state leakage reduction. In addition, the effective $V_{DS}$ or lateral drift field between source and drain is reduced, further reducing OFF-state leakage to some extent. With symmetric integration no extra mask is needed to selectively open the source or drain side after trench contact (TS) formation as both the source and drain BRS may integrated during the trench contact formation stages.

With reference to FIGS. 7-18, these figures depict an example process for fabricating a negative capacitance steep-switch field effect transistor (NCSS-FET) in accordance with an embodiment. In the embodiment illustrated in FIGS. 7-18, a fabrication system (not shown) asymmetrically co-integrates an IMT material as a BRS on either the source or drain at the S/D contact (CA) level (such as at a BEOL stage of fabrication) and a thin ferroelectric material a MOL stage of fabrication to add negative capacitance to the device. In particular embodiments, no additional mask is required to integrate the ferroelectric material during fabrication.

Figure 7:
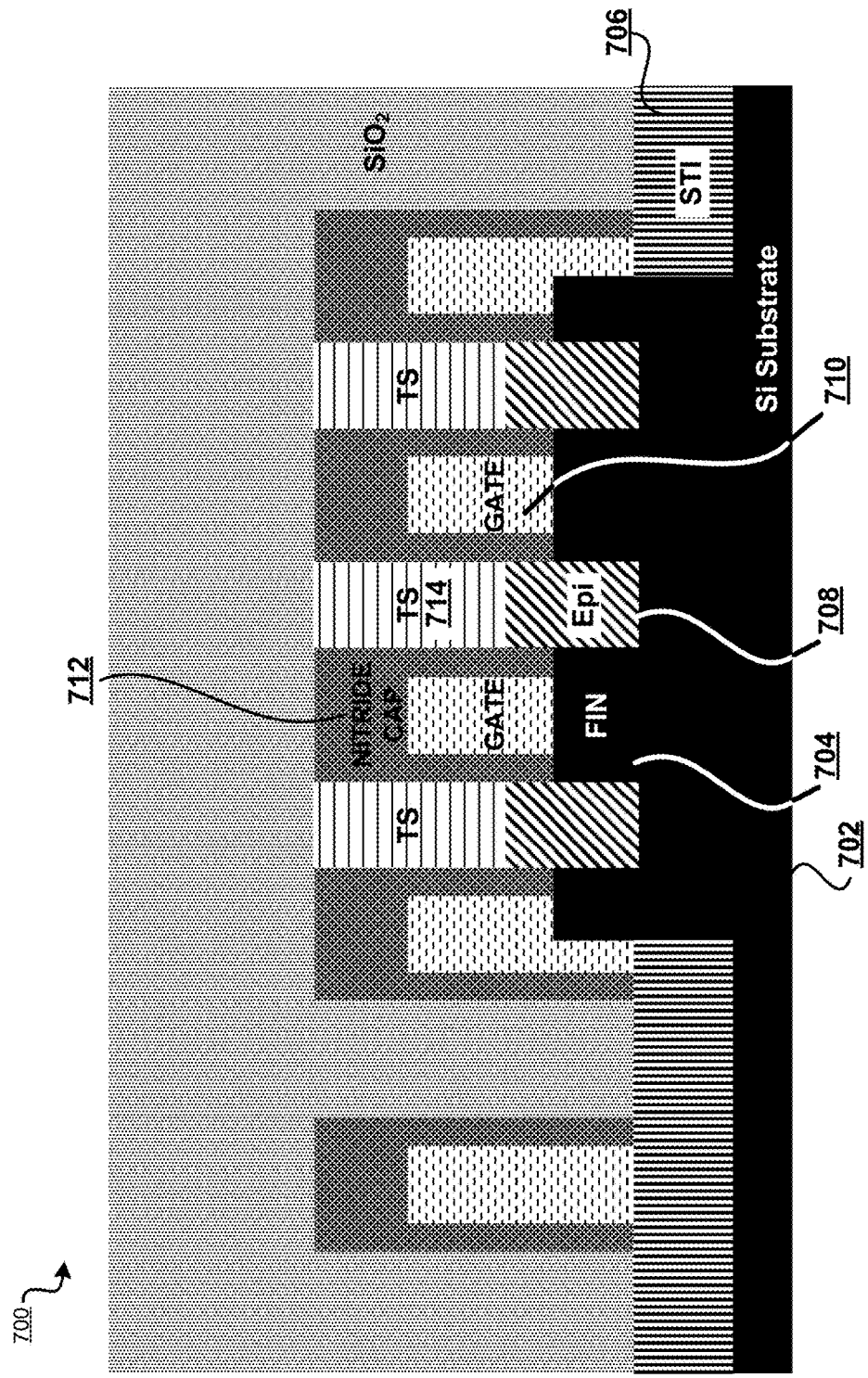
FIG. 7 depicts a portion of an example process for fabricating a NCSS-FET in accordance with an embodiment.

With reference to FIG. 7, this figure depicts a portion of the process in which a semiconductor structure 700 is received by a fabrication system. Structure 700 includes a substrate 702 having a number of fins 704 disposed thereon. In a particular embodiment, substrate 702 and fins 704 are formed of a silicon (Si) material. A shallow trench isolation (STI) layer 706 is disposed upon substrate 702. In particular embodiments, STI 706 is formed of a silicon dioxide (SiO2) material. In the embodiment, source/drains (S/D) 708 are disposed adjacent to fins 704, and gates 710 are disposed upon fins 704. In particular embodiments, S/D 708 is formed by an epitaxial growth process. In the embodiment, a nitride cap 712 covers gate 710. Trench contacts (TS) 714 are deposited within trenches of nitride cap 712 upon S/D 708. An inter-layer dielectric (ILD) covers trench contacts (TS) 714 and nitride cap 712.

Figure 8:
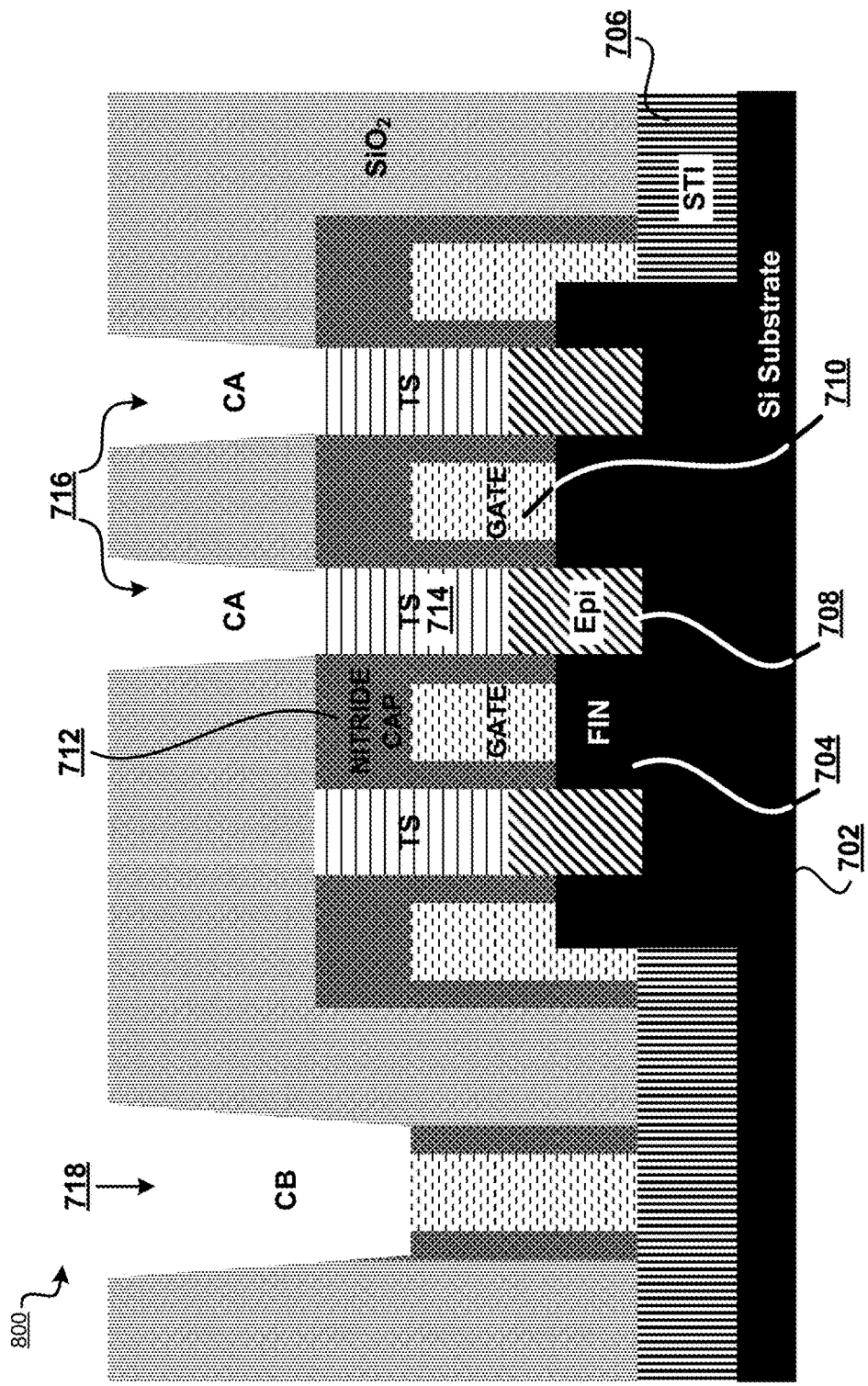
FIG. 8 depicts another portion of the example process for fabricating an NCSS-FET in accordance with an embodiment.

With reference to FIG. 8, this figure depicts another portion of a process in which a structure 800 is formed. In the embodiment, the fabrication system forms source/drain recesses 716 above one or more trench contacts 714, and forms a gate recess 718 above a gate 710 within STI 706. In a particular embodiment, the recesses 716, 718 are formed in the inter-layer dielectric (ILD) by a reactive ion etching (RIE) process.

Figure 9:
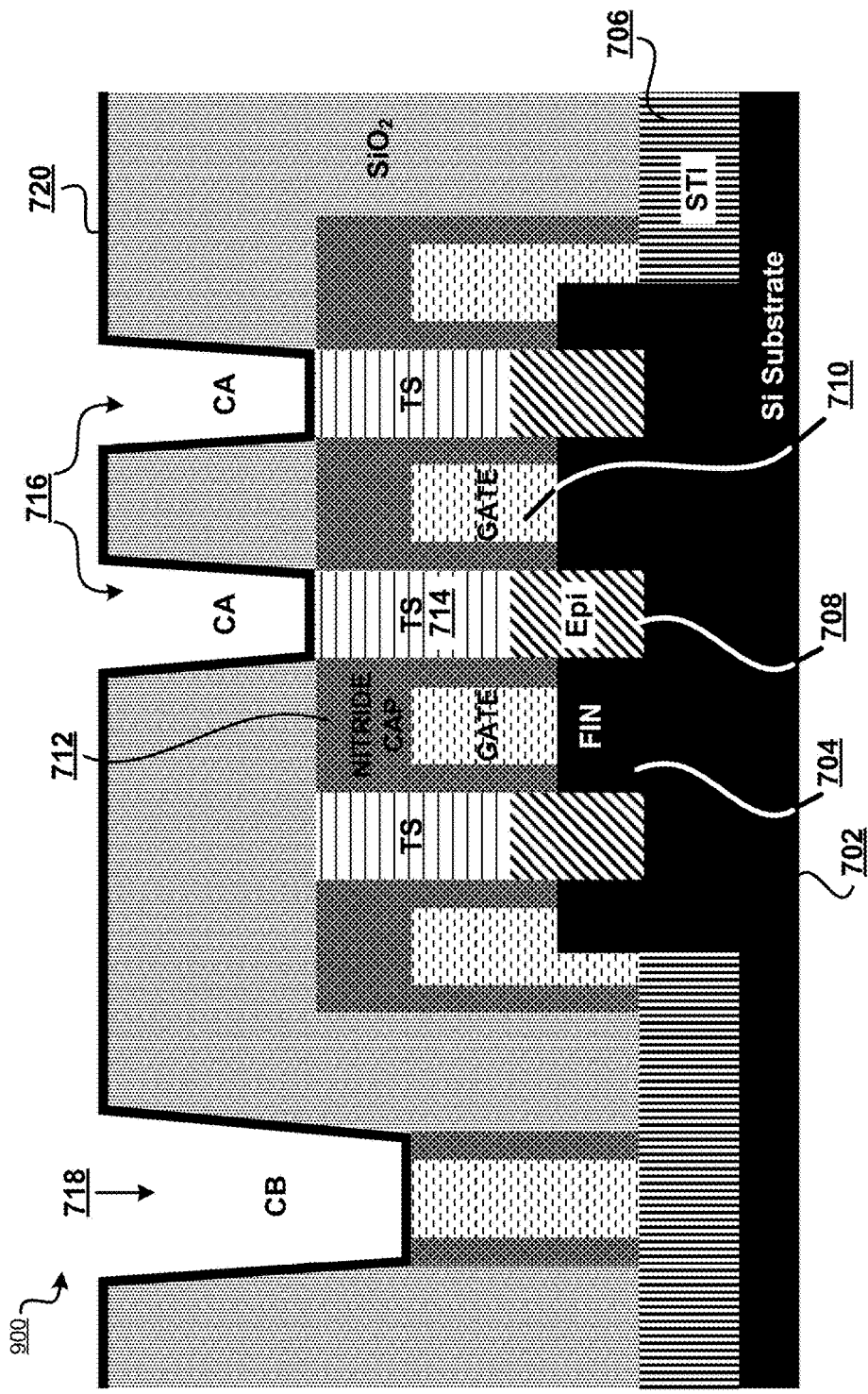
FIG. 9 depicts another portion of the example process for fabricating an NCSS-FET in accordance with an embodiment.

With reference to FIG. 9, this figure depicts another portion of a process in which a structure 900 is formed. In the embodiment, the fabrication system conformally deposits a ferroelectric material upon the top surface of the inter-layer dielectric and recesses 716 and 718.

Figure 10:
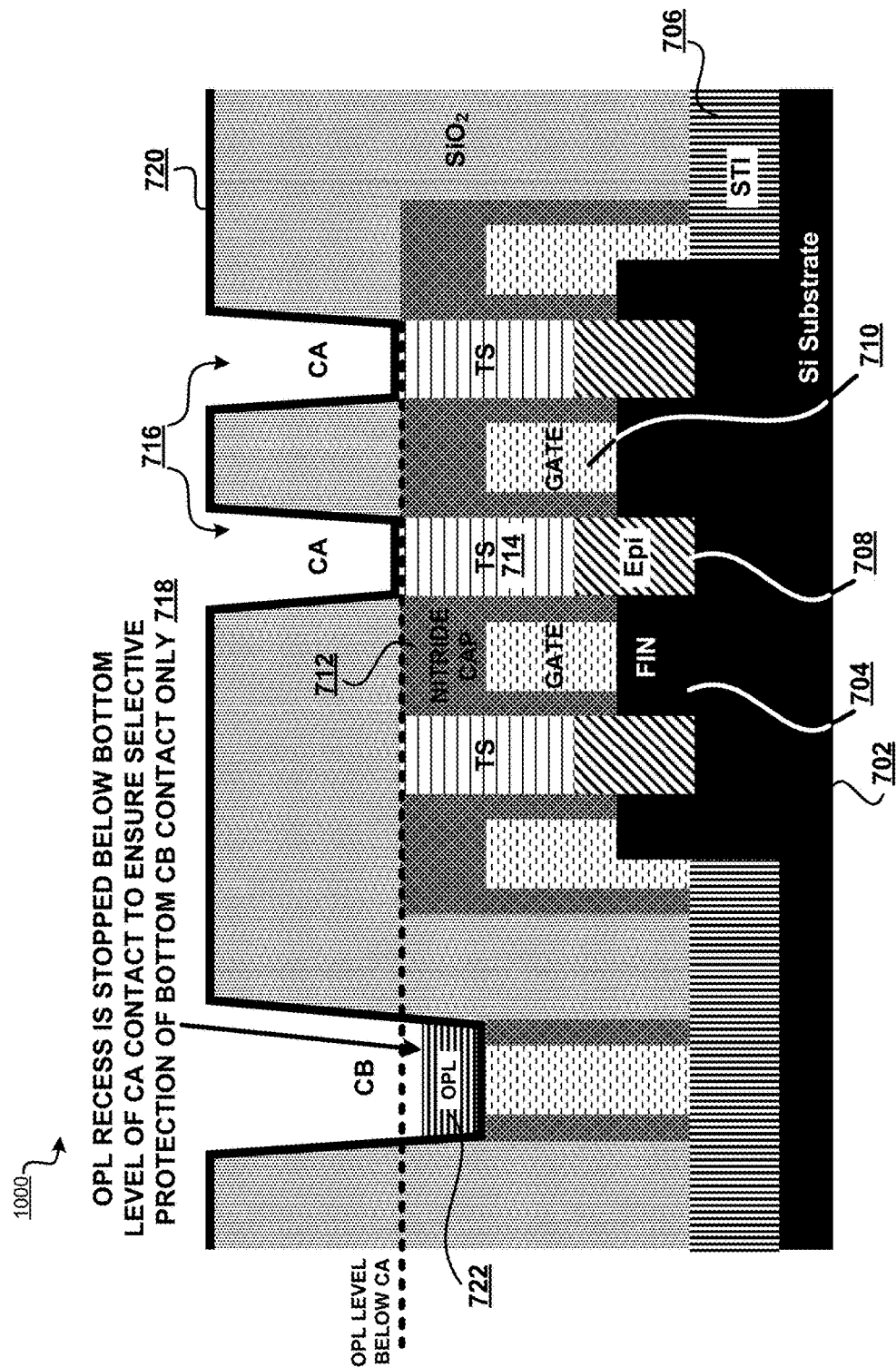
FIG. 10 depicts another portion of the example process for fabricating an NCSS-FET in accordance with an embodiment.

With reference to FIG. 10, this figure depicts another portion of a process in which a structure 1000 is formed. The fabrication system deposits conformally an organic planarization layer (OPL) 722 which is further etched back to selectively mask the bottom portion of gate recess 718. In a particular embodiment, the etch back of the OPL layer 722 is stopped below the bottom level of the S/D recess 716 to ensure selective protection of the bottom of gate recess 718.

Figure 11:
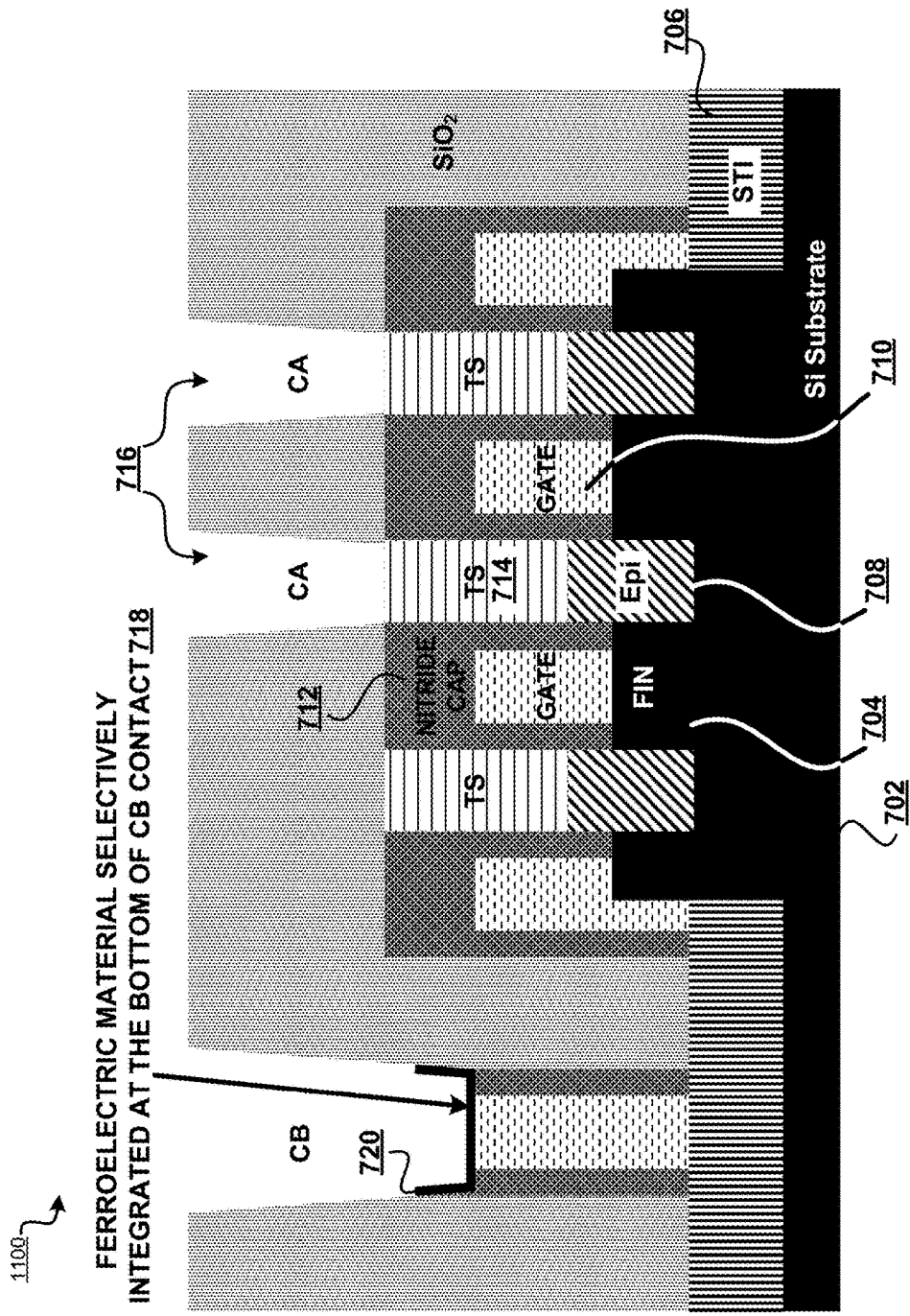
FIG. 11 depicts another portion of the example process for fabricating an NCSS-FET in accordance with an embodiment.

With reference to FIG. 11, this figure depicts another portion of a process in which a structure 1100 is formed. In the embodiment, the fabrication system etches back conformally the ferroelectric material 720 except for the ferroelectric material 720 protected by OPL 722 in the bottom of gate recess 718. In the embodiment, the fabrication system further strips OPL 722 such that ferroelectric material 720 is selectively integrated at the bottom of gate recess 718.

Figure 12:
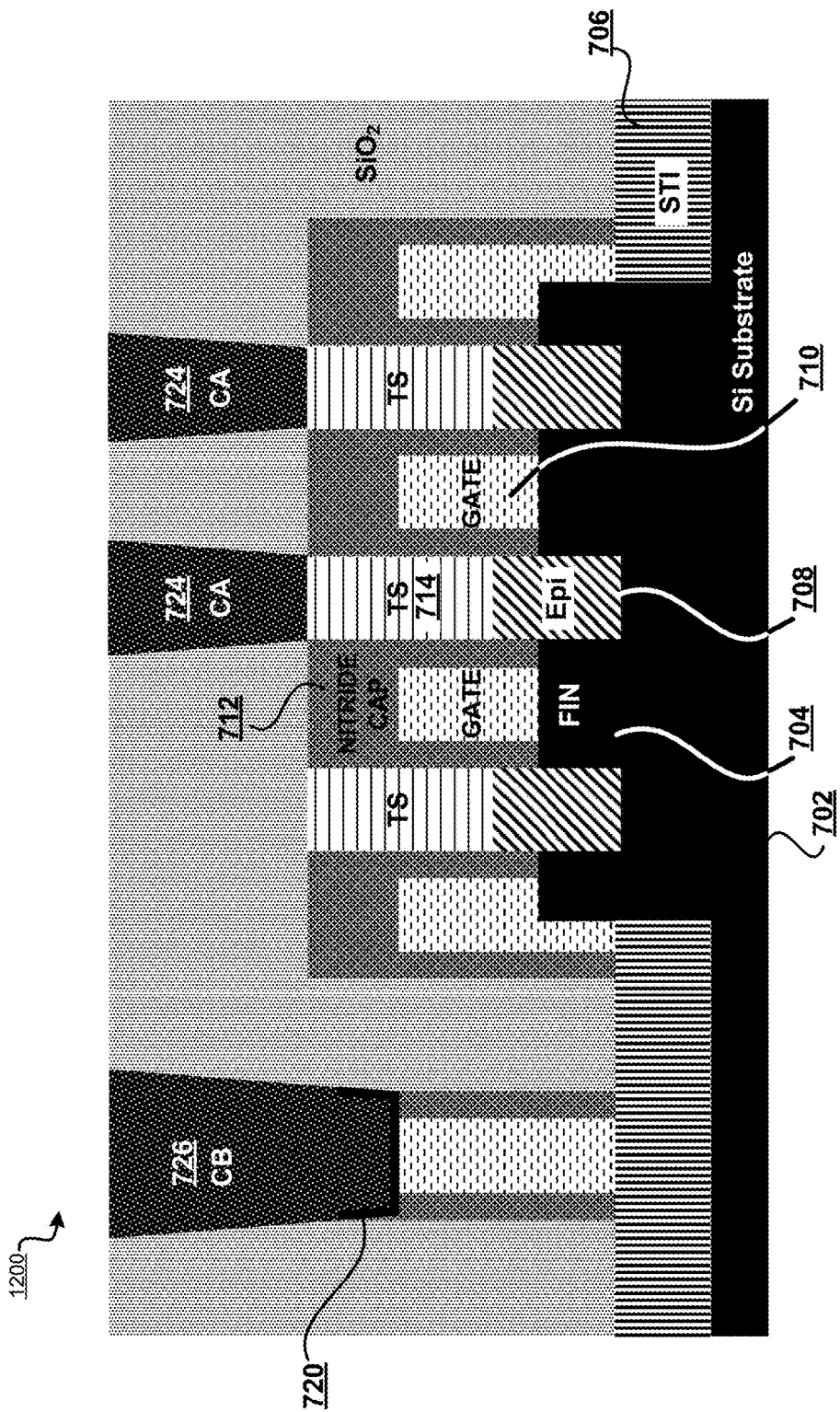
FIG. 12 depicts another portion of the example process for fabricating an NCSS-FET in accordance with an embodiment.

With respect to FIG. 12, this figure depicts another portion of a process in which a structure 1200 is formed. The fabrication system forms source/drain contacts 724 within source/drain recesses 716 in contact with trench contacts 714, and forms gate contact 726 within gate recess 718 in contact with ferroelectric material 720.

Figure 13:
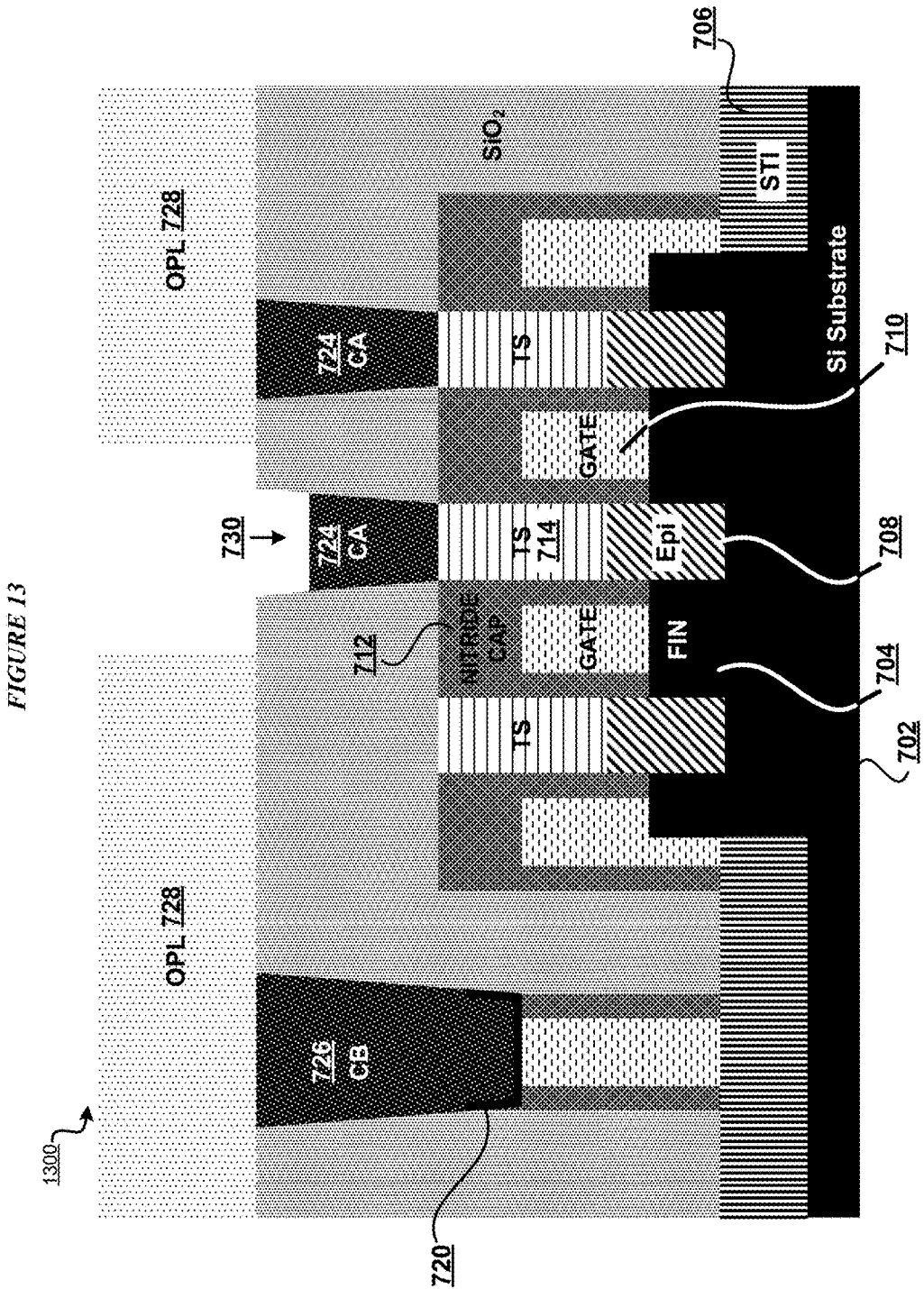
FIG. 13 depicts another portion of the example process for fabricating an NCSS-FET in accordance with an embodiment.

With respect to FIG. 13, this figure depicts another portion of a process in which a structure 1300 is formed. In the embodiment, the fabrication system applies an OPL 728 to mask portions of structure 1300 and performs recess patterning on S/D contact (CA) 724 to etch a portion of S/D contact (CA) 724 to form a recess 730 therein.

Figure 14:
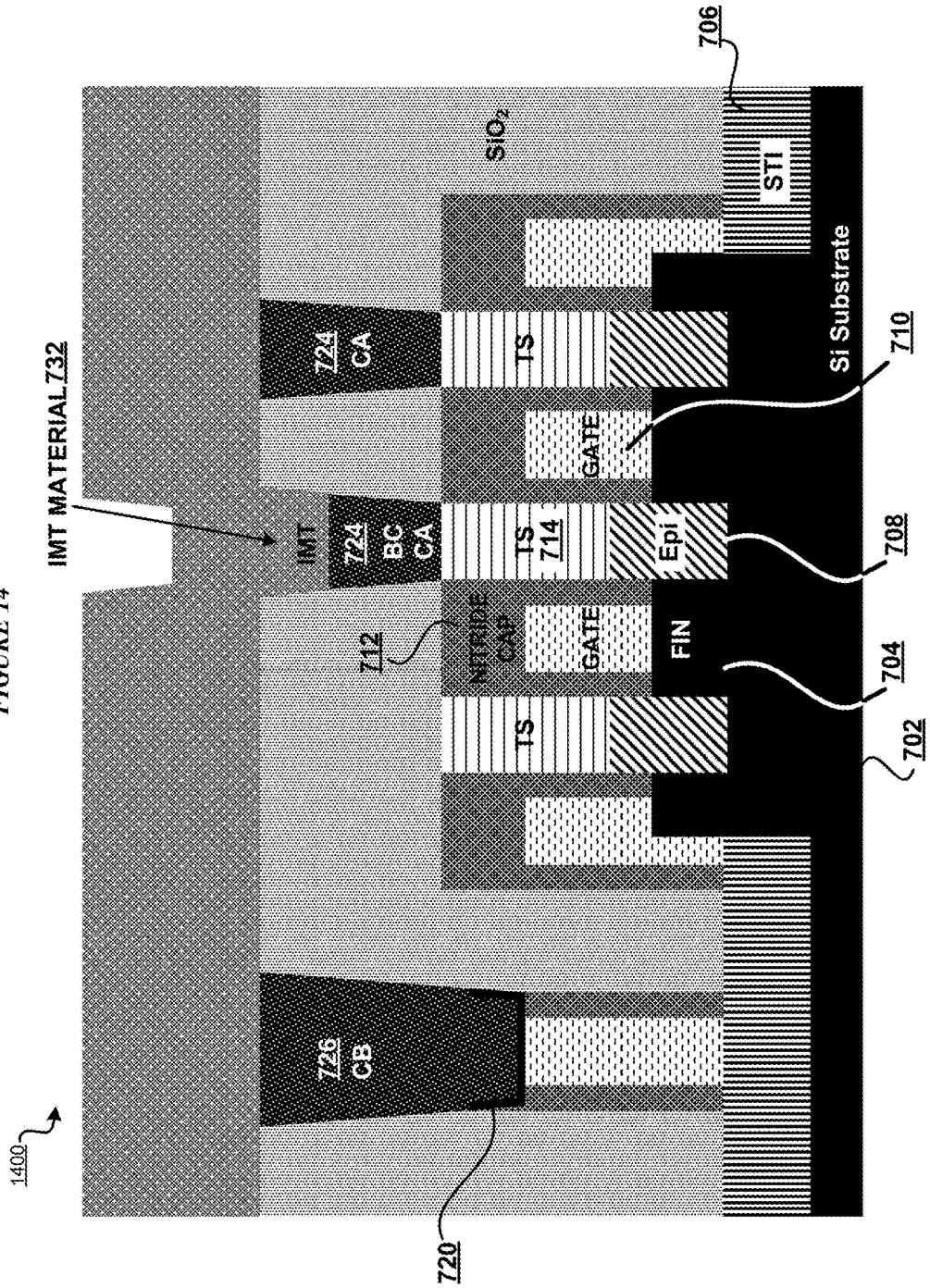
FIG. 14 depicts another portion of the example process for fabricating an NCSS-FET in accordance with an embodiment.

With respect to FIG. 14, this figure depicts another portion of a process in which a structure 1400 is formed. In the embodiment, the fabrication system deposits IMT material 732 within recess 730 in contact with S/D contact (CA) 724 and an upper surface of structure 1400 including the top surface of the inter-layer dielectric.

Figure 15:
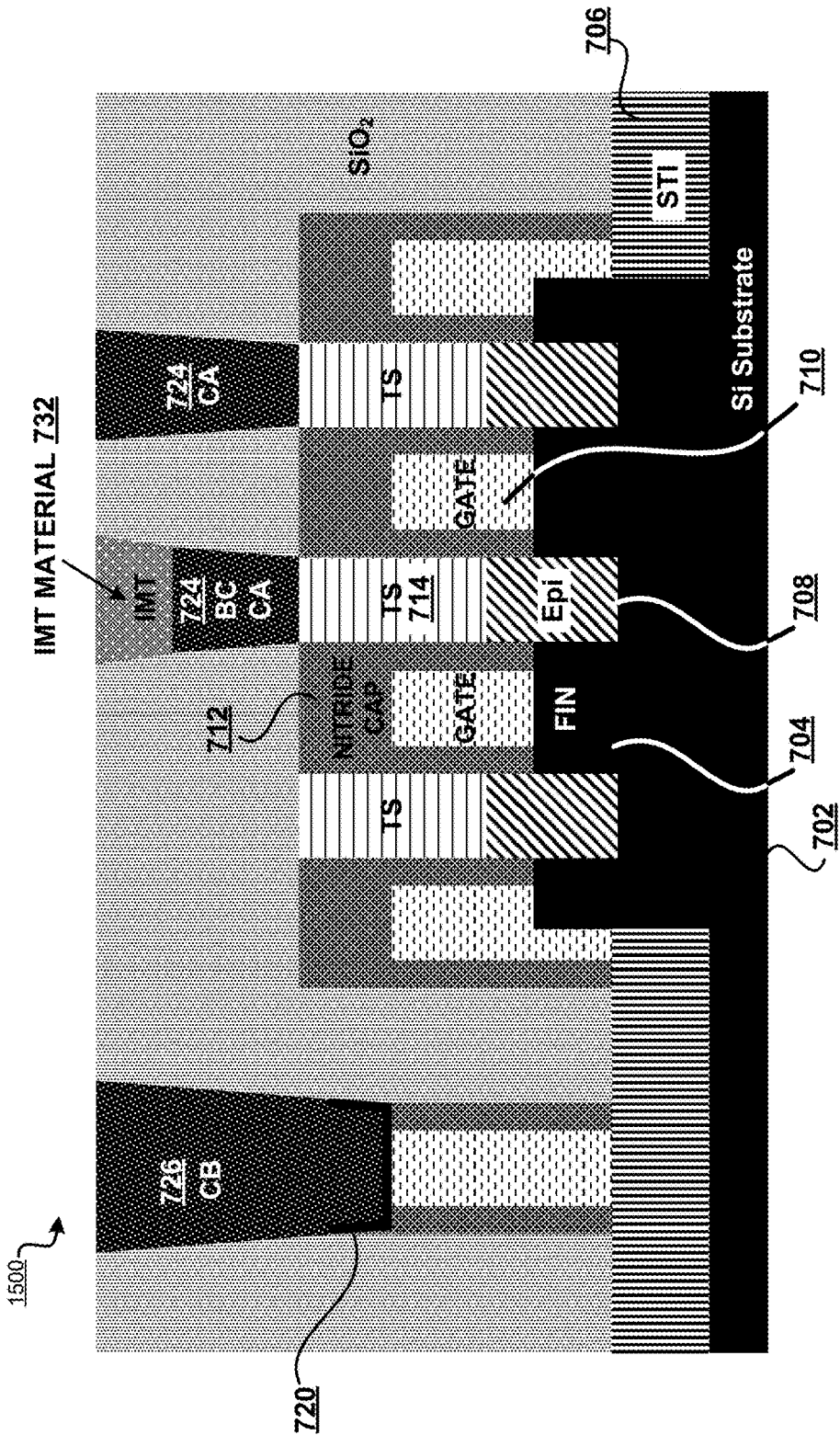
FIG. 15 depicts another portion of the example process for fabricating an NCSS-FET in accordance with an embodiment.

With reference to FIG. 15, this figure depicts another portion of a process in which a structure 1500 is formed. In the embodiment, the fabrication system planarizes IMT material 732 using a CMP process to remove IMT material 732 except for the portions of IMT material 732 deposited within recess 730.

Figure 16:
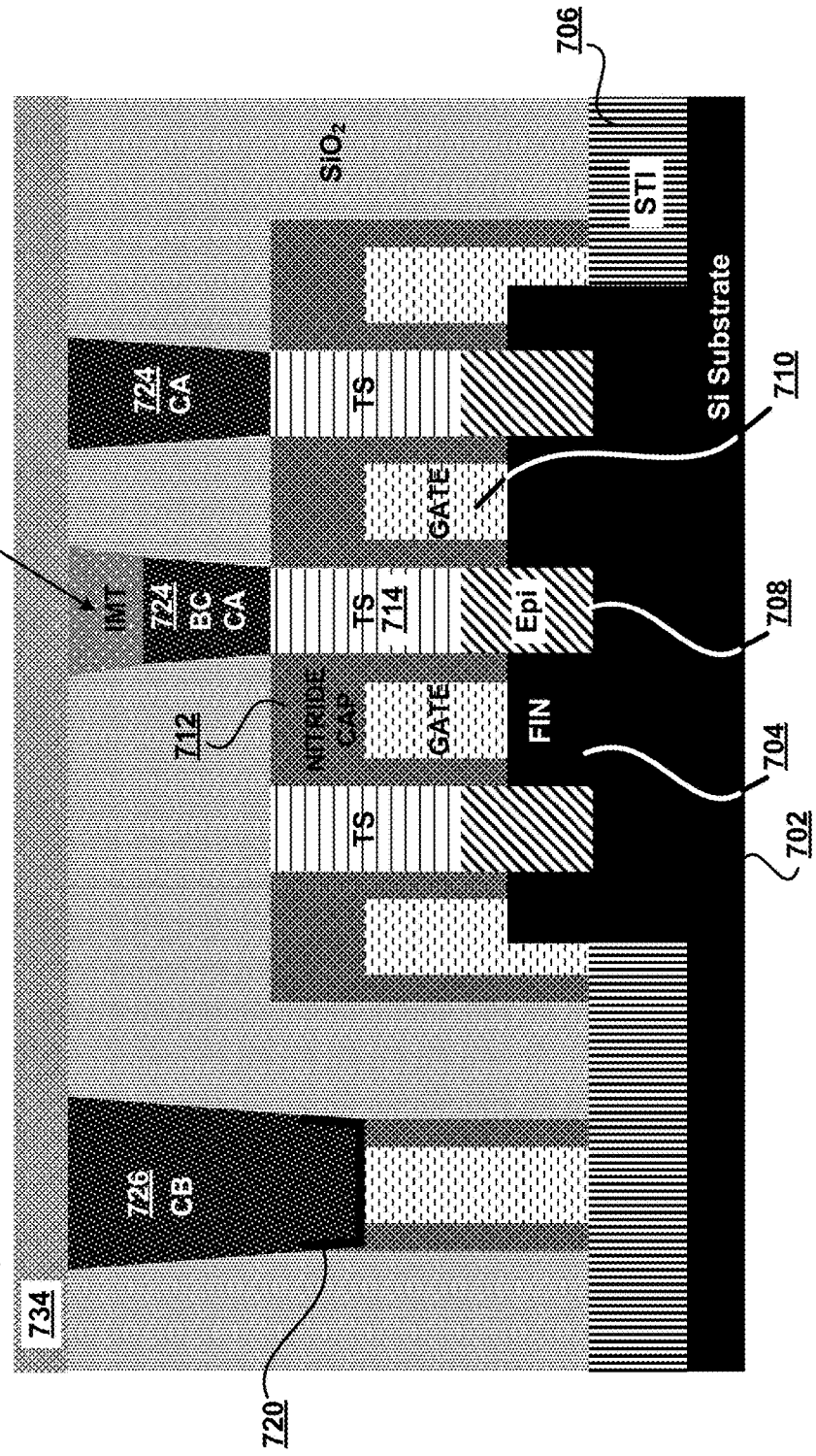
FIG. 16 depicts another portion of the example process for fabricating an NCSS-FET in accordance with an embodiment.

With reference to FIG. 16, this figure depicts another portion of a process in which a structure 1600 is formed. In the embodiment, the fabrication system deposits an insulation cap layer (NBLOCK cap) 734 on a top surface of the structure 1600. In one or more embodiments, the insulation cap layer 734 functions to protect the metals underneath that can be easily damaged or oxidized.

Figure 17:
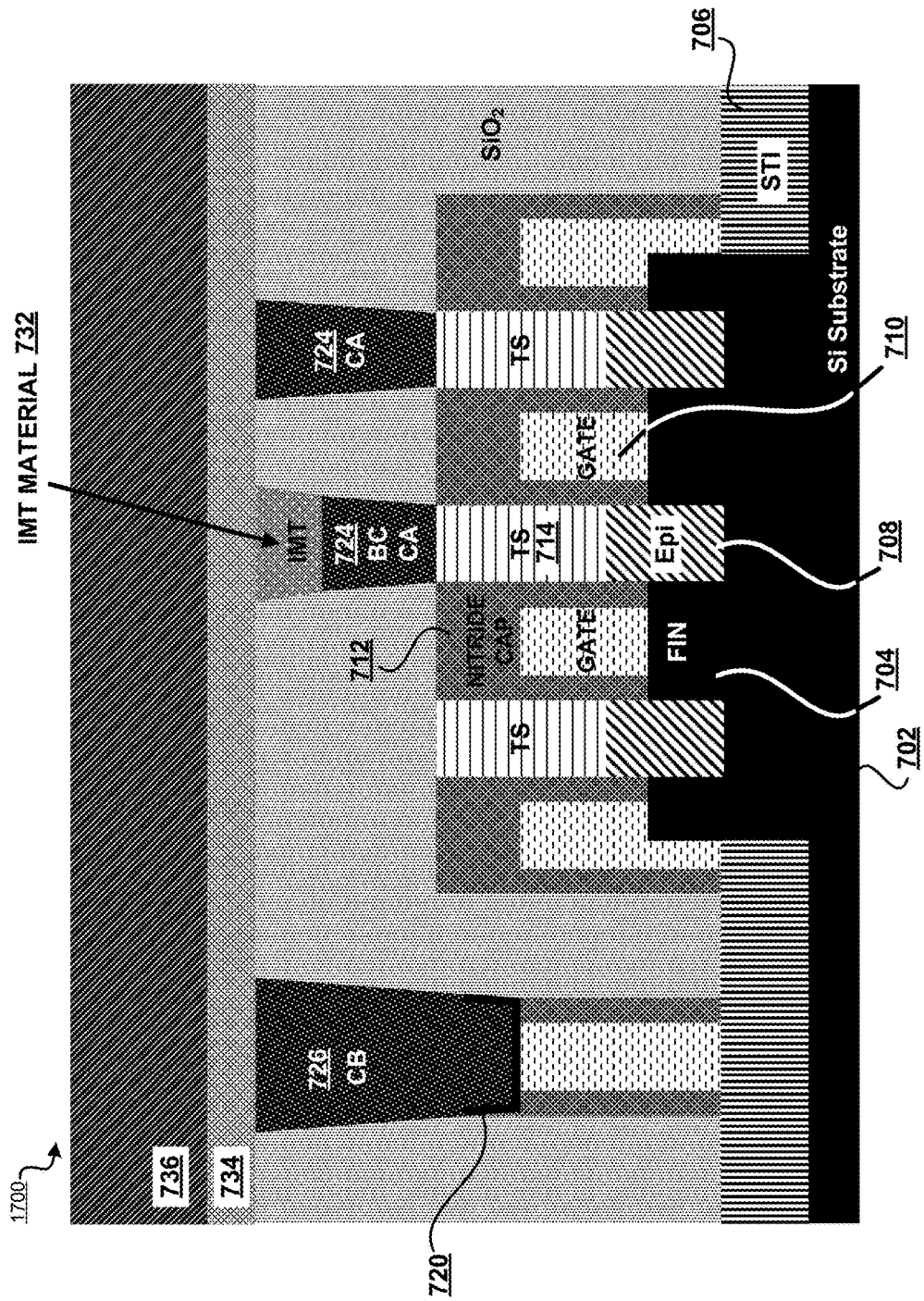
FIG. 17 depicts another portion of the example process for fabricating an NCSS-FET in accordance with an embodiment.

With reference to FIG. 17, this figure depicts another portion of a process in which a structure 1700 is formed. In the embodiment, the fabrication system deposits a dielectric layer 736 upon a top surface of insulation cap layer (NBLOCK cap) 734.

Figure 18:
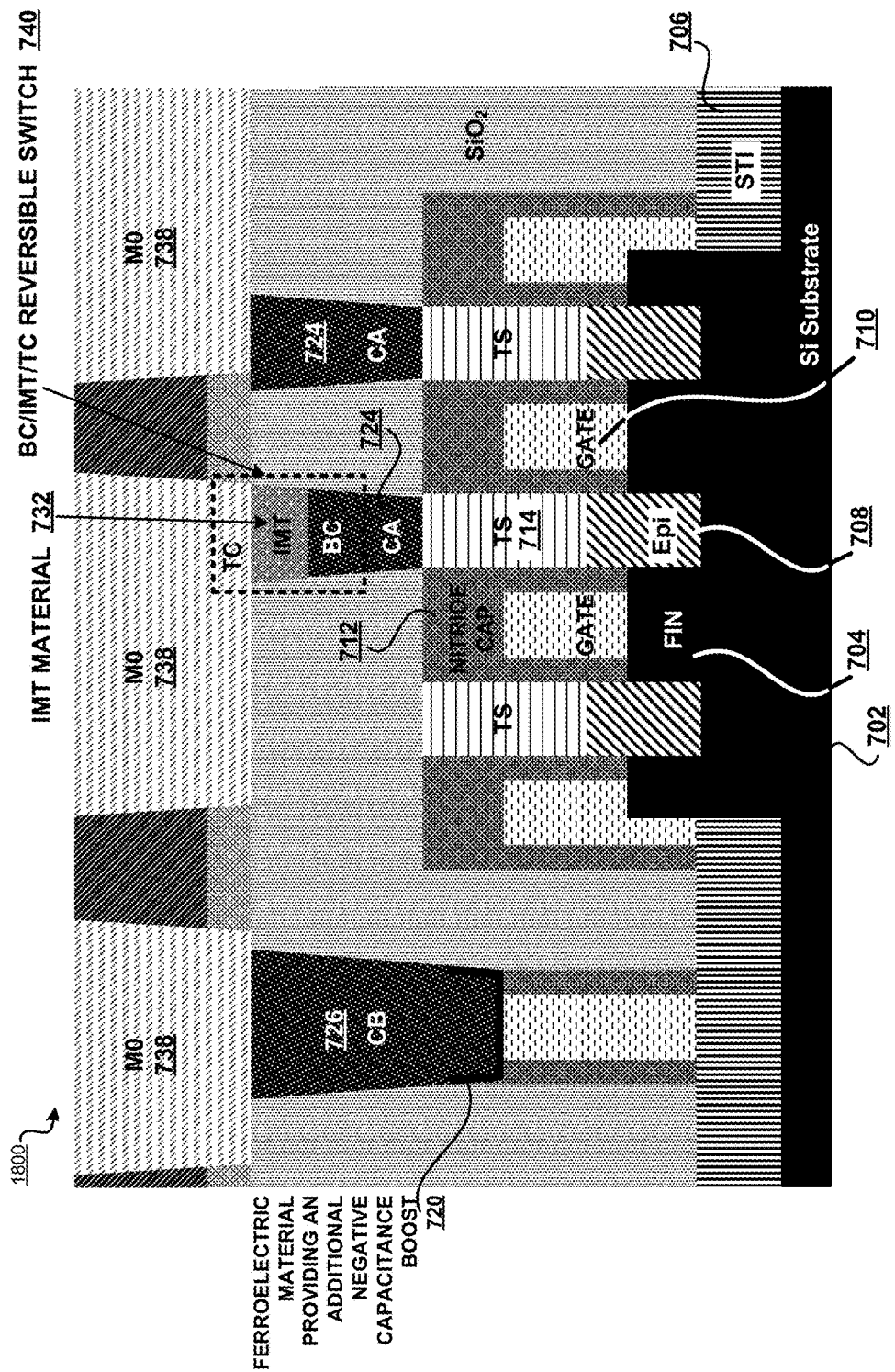
FIG. 18 depicts another portion of the example process for fabricating an NCSS-FET in accordance with an embodiment.

With reference to FIG. 18, this figure depicts another portion of a process in which a structure 1800 is formed. In the embodiment, the fabrication system deposits metallization contacts (MO) 738 on IMT material 732 such that the multilayer system created by the S/D contact (CA) 740, the IMT material 732, and the metallization layer contact (MO) 738 creates a reversible switch 740. A bottom portion of metallization layer contact (MO) 738 functions as a top contact (TC) of reversible switch 740, and a top portion of S/D contact (CA) 724 functions as a bottom contact (BC) of reversible switch 740. The fabrication system further planarizes metallization layer contact (MO) 738 using a CMP process. Accordingly, a negative capacitance steep-switch field effect transistor (NCSS-FET) is fabricated in accordance with an embodiment.

Figure 19:
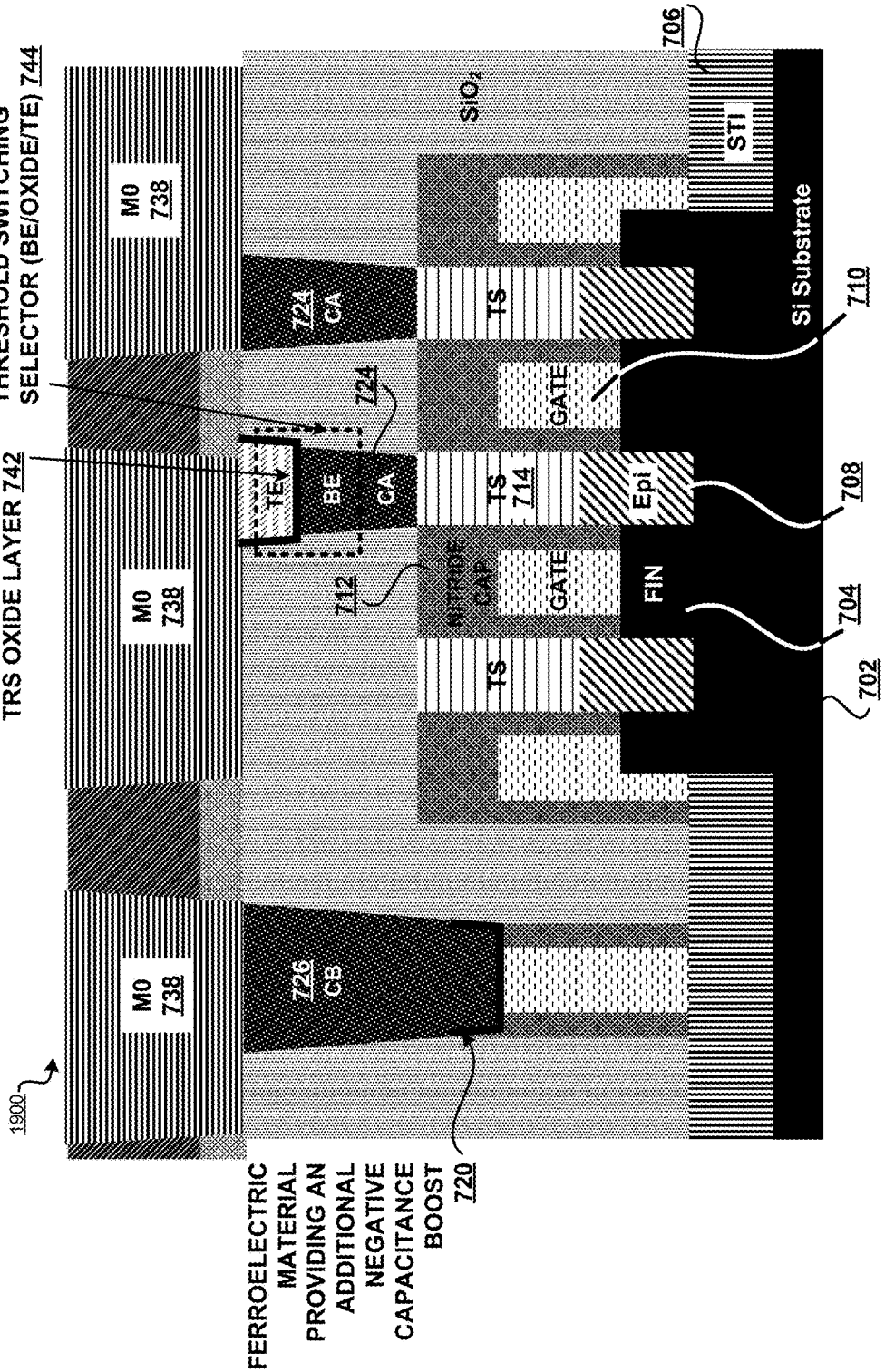
FIG. 19 depicts a structure of a NCSS-FET fabricated according to another embodiment of a process.

FIG. 19 depicts a structure 1900 of a negative capacitance steep-switch field effect transistor (NCSS-FET) fabricated according to another embodiment of a process. In one or more embodiments, the NCSS-FET is produced in a process similar that described with respect to FIGS. 7-18 except that the revisable switch 744 is replaced by a threshold switch selector (TSS) 744. In the embodiment, the process of depositing IMT material 732 described with respect to FIGS. 7-18 is replaced by a process of forming a TSS 744. In the embodiment, the fabrication applies an OPL to mask portions of the structure and performs recess patterning on S/D contact 724 to etch a portion of S/D contact 724 to form a recess therein. The fabrication system strips the OPL and deposits a conformal TRS oxide layer 742 within the recess in contact with S/D contact 724. In the embodiment, TRS oxide layer 742 hosts a volatile metallic filament driving the reversible switching behavior. In other embodiments, the oxide layer can be replaced with other suitable dielectric materials.

In the embodiment, the fabrication system deposits a TRS top electrode (TE) metallization layer upon the TRS oxide layer 742 forming a top electrode (TE) within the recess upon TRS oxide layer 742. In the embodiment, the fabrication system removes the TRS top electrode (TE) metallization layer except for the portion of TRS top electrode (TE) metallization layer deposited within the recess. In the embodiment, a TSS 744 is formed by the interface between the TRS top electrode (TE) metallization layer, TRS oxide layer 742, and S/D contact 724. Accordingly, a negative capacitance steep-switch field effect transistor (NCSS-FET) is fabricated in accordance with an embodiment.

Figure 20:
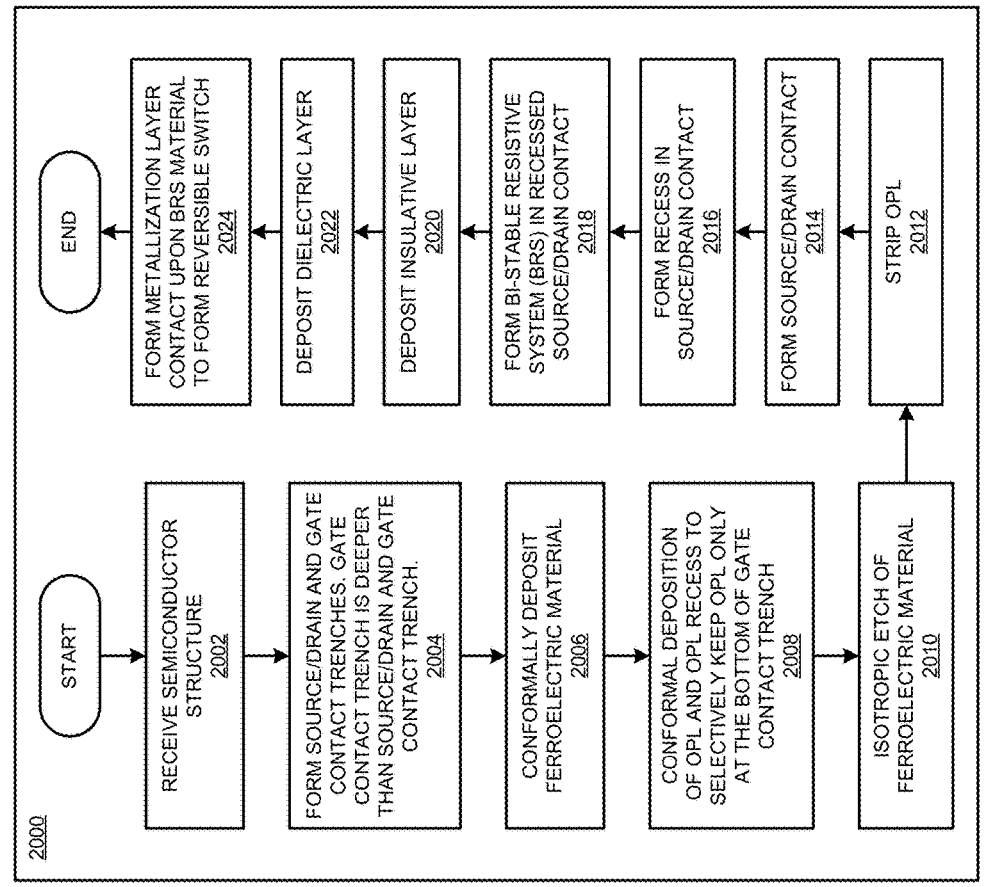
FIG. 20 depicts a flowchart of an example process for fabricating a negative capacitance steep-switch field effect transistor (NCSS-FET) in accordance with an illustrative embodiment.

With reference to FIG. 20, this figure depicts a flowchart of an example process 2000 for fabricating a negative capacitance steep-switch field effect transistor (NCSS-FET) in accordance with an illustrative embodiment. In block 2002, a fabrication system receives a semiconductor structure including a substrate, a fin disposed on the substrate, a source/drain disposed on the substrate adjacent to the fin, a gate, a cap disposed upon the gate, a trench contact disposed upon the source/drain, and a shallow trench isolation (STI) layer disposed upon the substrate, and an inter-layer dielectric covers the trench contact and cap.

In block 2004, the fabrication system forms a source/drain contact trench in the inter-layer dielectric extending to the trench contact, and forms a gate contact trench in the inter-layer dielectric extending to the gate. In a particular embodiment, the trenches are formed in the inter-layer dielectric by a reactive ion etching (RIE) process. In one or more embodiments, the gate contact trench is deeper than the source/drain contact trench. In block 2006, conformally deposits a ferroelectric material upon the top surface of the inter-layer dielectric and the S/D recess and gate recess. In block 2008, the fabrication system conformally deposits an organic planarization layer (OPL) and recesses the OPL to selectively keep the OPL only at the bottom of the gate contact trench. In a particular embodiment, the recess of the OPL layer is stopped below a bottom level of the S/D recess to ensure selective protection of the bottom of the gate contact trench.

In block 2010, the fabrication system isotropic etches back the ferroelectric material except for the ferroelectric material protected by the OPL in the bottom of the gate contact trench. In block 2012, the fabrication system strips the OPL such that the ferroelectric material is selectively integrated at the bottom of the gate recess.

In block 2014, the fabrication system forms a source/drain contact within the source/drain recess in contact with the trench contact, and forms a gate contact within the gate recess in contact with the ferroelectric material.

In block 2016, the fabrication system forms a recess in the source/drain contact. In block 2018, the fabrication system forms a bi-stable resistive system (BRS) in the recess of the source/drain contact. In a particular embodiment, the fabrication system deposits a bi-stable resistive system (BRS) material in the recess of the source/drain contact. In a particular embodiment, the BRS material includes an IMT material. In another embodiment, the BRS material includes a TSS material.

In block 2020, the fabrication system deposits an insulation cap layer on a top surface of the structure. In block 2022, the fabrication system deposits a dielectric layer upon a top surface of the insulation cap layer. In block 2024, the fabrication system deposits metallization contacts (MO) 738 on the BRS such that the multilayer system created by the S/D contact (CA), the IMT material 732, and the metallization layer contact (MO) creates a reversible switch. A bottom portion of the metallization layer contact (MO) functions as a top contact (TC) of the reversible switch, and a top portion of the S/D contact functions as a bottom contact (BC) of the reversible switch 740. In an embodiment, the fabrication system further planarizes the metallization layer contact (MO) using a CMP process. The process 2000 then ends. Accordingly, a negative capacitance steep-switch field effect transistor (NCSS-FET) is fabricated in accordance with an embodiment.

Thus, a computer implemented method, system or apparatus, and computer program product are provided in the illustrative embodiments for fabricating NCSS-FETs and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for fabricating a negative capacitance steep-switch transistor comprising:
    receiving a semiconductor structure including a substrate, a fin disposed on the substrate, a source/drain disposed on the substrate adjacent to the fin, a gate, a cap disposed upon the gate, a trench contact disposed upon the source/drain, a shallow trench isolation (STI) layer disposed upon the substrate, and an inter-layer dielectric disposed on the trench contact and the cap;
    forming a source/drain recess in the inter-layer dielectric extending to the trench contact;
    forming a gate recess in the inter-layer dielectric extending to the gate;
    depositing a ferroelectric material within the gate recess;
    forming a source/drain contact within the source/drain recess in contact with the trench contact;
    forming a gate contact within the gate recess in contact with the ferroelectric material;
    forming a contact recess in a portion of the source/drain contact;
    depositing a bi-stable resistive system (BRS) material in the contact recess in contact with the portion of the source/drain contact; and
    forming a metallization layer contact upon the BRS material, a portion of the source/drain contact, the BRS material, and a portion of the metallization layer contact forming a reversible switch.

2. The method of claim 1, wherein depositing the ferroelectric material within the gate recess further comprises:
    conformally depositing the ferroelectric material upon a top surface of the inter-layer dielectric, the S/D recess, and the gate recess;
    depositing an organic planarization layer (OPL) to a bottom portion of the gate recess to mask the bottom portion of the gate recess;
    etching the ferroelectric material except for the ferroelectric material masked by the OPL in the bottom portion of the gate recess; and
    stripping the OPL from the gate recess.

3. The method of claim 1, wherein the source/drain recess and the gate recess are formed in the inter-layer dielectric by a reactive ion etching (RIE) process.

4. The method of claim 1, wherein the BRS material comprises an insulator-to-metal transition (IMT) material.

5. The method of claim 4, wherein depositing the BRS material in the source/drain recess includes depositing the IMT material in contact with the portion of the source/drain contact.

6. The method of claim 4, further comprising:
    removing a portion of the IMT material outside of the source/drain recess using a planarization process.

7. The method of claim 6, wherein the planarization process includes a chemical mechanical planarization (CMP) process.

8. The method of claim 1, wherein the BRS material comprises a threshold-switching selector.

9. The method of claim 8, wherein depositing the BRS material in the source/drain recess comprises:
    depositing an oxide layer within the recess; and forming a top electrode within the recess upon the oxide layer.

10. The method of claim 1, further comprising:
applying an insulation cap layer to the structure; and
depositing a dielectric layer upon the insulation layer, the metallization layer contact being formed through the insulation cap layer and the dielectric layer.

11. An apparatus comprising:
a semiconductor structure including a substrate, a fin disposed on the substrate, a source/drain disposed on the substrate adjacent to the fin, a gate, a cap disposed upon the gate, a trench contact disposed upon the source/drain, a shallow trench isolation (STI) layer disposed upon the substrate, and an inter-layer dielectric disposed on the trench contact and the cap;
a source/drain recess formed in the inter-layer dielectric extending to the trench contact;
a gate recess formed in the inter-layer dielectric extending to the gate;
a ferroelectric material deposited within the gate recess;
a source/drain contact formed within the source/drain recess in contact with the trench contact;
a gate contact formed within the gate recess in contact with the ferroelectric material;
a contact recess formed in a portion of the source/drain contact;
a bi-stable resistive system (BRS) material deposited in the contact recess in contact with the portion of the source/drain contact; and
a metallization layer contact formed upon the BRS material, a portion of the source/drain contact, the BRS material, and a portion of the metallization layer contact forming a reversible switch.

12. The apparatus of claim 11, wherein the ferroelectric material is deposited within the gate recess by:
conformally depositing the ferroelectric material upon a top surface of the inter-layer dielectric, the S/D recess, and the gate recess;
depositing an organic planarization layer (OPL) to a bottom portion of the gate recess to mask the bottom portion of the gate recess;
etching the ferroelectric material except for the ferroelectric material masked by the OPL in the bottom portion of the gate recess; and
stripping the OPL from the gate recess.

13. The apparatus of claim 11, wherein the source/drain recess and the gate recess are formed in the inter-layer dielectric by a reactive ion etching (RIE) process.

14. The apparatus of claim 11, wherein the BRS material comprises an insulator-to-metal transition (IMT) material.

15. The apparatus of claim 14, wherein the BRS material in the source/drain recess is deposited by depositing the IMT material in contact with the portion of the source/drain contact.

16. The apparatus of claim 14, wherein a portion of the IMT material outside of the source/drain recess is removed using a planarization process.

17. The apparatus of claim 16, wherein the planarization process includes a chemical mechanical planarization (CMP) process.

18. A computer usable program product comprising one or more computer-readable storage devices, and program instructions stored on at least one of the one or more storage devices, the stored program instructions comprising:
program instructions to receive a semiconductor structure including a substrate, a fin disposed on the substrate, a source/drain disposed on the substrate adjacent to the fin, a gate, a cap disposed upon the gate, a trench contact disposed upon the source/drain, a shallow trench isolation (STI) layer disposed upon the substrate, and an inter-layer dielectric disposed on the trench contact and the cap;
program instructions to form a source/drain recess in the inter-layer dielectric extending to the trench contact;
program instructions to form a gate recess in the inter-layer dielectric extending to the gate;
program instructions to deposit a ferroelectric material within the gate recess;
program instructions to form a source/drain contact within the source/drain recess in contact with the trench contact;
program instructions to form a gate contact within the gate recess in contact with the ferroelectric material;
program instructions to form a contact recess in a portion of the source/drain contact;
program instructions to deposit a bi-stable resistive system (BRS) material in the contact recess in contact with the portion of the source/drain contact; and
program instructions to form a metallization layer contact upon the BRS material, a portion of the source/drain contact, the BRS material, and a portion of the metallization layer contact forming a reversible switch.

19. The computer usable program product of claim 18, wherein the computer usable code is stored in a computer readable storage device in a data processing system, and wherein the computer usable code is transferred over a network from a remote data processing system.

20. The computer usable program product of claim 15, wherein the computer usable code is stored in a computer readable storage device in a server data processing system, and wherein the computer usable code is downloaded over a network to a remote data processing system for use in a computer readable storage device associated with the remote data processing system.

* * * * *